United States Patent
Li et al.

(10) Patent No.: US 11,320,481 B2
(45) Date of Patent: May 3, 2022

(54) HIGH VOLTAGE INTERLOCK CIRCUIT AND DETECTION METHOD

(71) Applicant: Contemporary Amperex Technology Co., Limited, Ningde (CN)

(72) Inventors: Jinglin Li, Ningde (CN); Jianwei Zhuo, Ningde (CN); Changjian Liu, Ningde (CN); Qiandeng Li, Ningde (CN)

(73) Assignee: Contemporary Amperex Tectaology Co., Limited, Ningde (CN)

( * ) Notice: Subject to any disclaimer, the term of this patent is extended or adjusted under 35 U.S.C. 154(b) by 336 days.

(21) Appl. No.: 16/798,365

(22) Filed: Feb. 22, 2020

(65) Prior Publication Data

US 2020/0274289 A1  Aug. 27, 2020

(30) Foreign Application Priority Data

Feb. 25, 2019 (CN) .......................... 201910143766.8

(51) Int. Cl.
*G01R 31/00* (2006.01)
*G01R 31/316* (2006.01)
*B60L 50/16* (2019.01)

(52) U.S. Cl.
CPC ............ *G01R 31/316* (2013.01); *B60L 50/16* (2019.02)

(58) Field of Classification Search
CPC ......... H03K 5/134; H03K 2005/00123; H03K 2005/00195

(Continued)

(56) References Cited

U.S. PATENT DOCUMENTS 8,571,738 B1  10/2013  Potter et al.
8,571,739 B2* 10/2013  Fleckner ................. B60L 50/16
                                                      701/22

(Continued)

FOREIGN PATENT DOCUMENTS

CN  105403784 A   3/2016
CN  107255782 A  10/2017

(Continued)

OTHER PUBLICATIONS

The Second Office Action for CN Application No. 201910143766.8, dated Sep. 5, 2019, 10 pages.

(Continued)

*Primary Examiner* — Ryan Jager
(74) *Attorney, Agent, or Firm* — Law Offices of Liaoteng Wang

(57) ABSTRACT

The disclosure provides high voltage interlock circuit and detection method. The circuit comprises: a power module, a positive electrode of the power module being connected to one end of a current generating module; the current generating module, the other end of the current generating module being connected to a first terminal of a high voltage component module to inject a constant DC current into the high voltage component module; a first voltage dividing module, one end of the first voltage dividing module being connected to a second terminal of the high voltage component module, and the other end of the first voltage dividing module being connected to a negative electrode of the power module and a power ground; and a processing module to determine a fault of the high voltage component module based on a first voltage collected from the second terminal of the high voltage component module.

13 Claims, 12 Drawing Sheets

(58) Field of Classification Search
USPC .......................................................... 307/328
See application file for complete search history.

(56) References Cited

U.S. PATENT DOCUMENTS

2020/0274289 A1* 8/2020 Li ........................ H01R 13/701
2020/0348365 A1* 11/2020 Wang ....................... G01K 3/10
2020/0350770 A1* 11/2020 Dan .................... H01M 10/486

FOREIGN PATENT DOCUMENTS

| CN | 105313700 B | 3/2018 |
| CN | 108387809 A | 8/2018 |
| CN | 208207183 U | 12/2018 |
| DE | 102010048348 A1 | 5/2011 |

OTHER PUBLICATIONS

The Rejection Decision for CN Application No. 201910143766.8, dated Nov. 27, 2019, 5 pages.
The First Official Action and search report dated Aug. 9, 2019 for Chinese application No. 201910143766.8, 8 pages.
The extended European search report for EP1 Application No. 20159360.5, dated Jul. 16, 2020, 21 pages.
The extended European search report for EP2 Application No. 21154075.2, dated May 11, 2021, 8 pages.

* cited by examiner

HIGH VOLTAGE INTERLOCK CIRCUIT AND DETECTION METHOD

CROSS REFERENCE TO RELATED APPLICATION

The present application is based upon and claims the benefits of Chinese Patent Application No. 201910143766.8 filed on Feb. 25, 2019, the entire contents of which are incorporated herein by reference.

FIELD

The present disclosure generally relates to new energies, in particular to a high voltage interlock circuit and a detection method thereof.

BACKGROUND

Electric vehicles have become the development trend of the automotive industry. Power battery pack is a power source for the electric vehicles. High voltage safety of the power battery pack needs to be placed in the primary consideration of a power battery system. Reliability of a high voltage circuit connection is a factor of the high voltage safety. Therefore, a high voltage interlock circuit for monitoring On-Off condition among various high voltage components of an electric vehicle plays an extremely important role. For example, the high voltage components may be a high voltage connector, a manual service disconnect (MSD), or a high voltage power supply device, and the like.

At present, the high voltage interlock circuit is mostly of a voltage type. Due to a large range of variation of contact impedance among the high voltage components and fluctuations in supply voltage, it is prone to false alarms of high voltage interlock circuit failures due to external interference (e.g., static electricity). As a result, fault detection accuracy is low.

SUMMARY

Embodiments of the present disclosure provides a high voltage interlock circuit and a detection method thereof, which can improve accuracy of detection of fault for the high voltage interlock circuit.

In an aspect, the present disclosure provides a high voltage interlock circuit. The circuit may include: a power module, wherein a positive electrode of the power module is connected to one end of a current generating module; the current generating module, wherein the other end of the current generating module is connected to a first terminal of a high voltage component module to inject a constant direct current (DC) current into the high voltage component module; a first voltage dividing module, wherein one end of the first voltage dividing module is connected to a second terminal of the high voltage component module, and the other end of the first voltage dividing module is respectively connected to a negative electrode of the power module and a power ground; and a processing module configured to determine a fault of the high voltage component module based on a first voltage collected from the second terminal of the high voltage component module.

In another aspect, the disclosure provides a method for detection of the high voltage interlock circuit provided in the disclosure. The method may include: determining a fault of the high voltage component module based on a first voltage collected from the second terminal of the high voltage component module.

In the high voltage interlock circuit and the detection method thereof in accordance with the embodiments of the disclosure, a current generating module capable of generating a constant DC current is set in the high voltage interlock circuit, then the fault of the high voltage component module can be determined using the voltage of one end of the high voltage component module. As a result, interference from external signals can be reduced, and the accuracy of determination of the fault of the high voltage interlock circuit can be improved.

BRIEF DESCRIPTION OF THE DRAWINGS

In order to more clearly illustrate the technical solutions of the embodiments of the disclosure, drawings used in the embodiments of the disclosure will be briefly described below. For those skilled in the art, without any creative work, other drawings can be obtained from these figures.

DETAILED DESCRIPTION

In order to make objects, technical solutions and advantages of the disclosure more clear, features and exemplary embodiments of the disclosure in various aspects will be described in detail below with reference to the accompanying drawings. It is understood that the specific embodiments described herein are only to be construed as illustrative and not limiting. The disclosure may be practiced without some of the specific details to the skilled in the art. The following description of the embodiments is merely intended to provide a better understanding of the disclosure.

It should be noted that, in this context, relational terms such as "first" and "second" are used merely to distinguish one entity or operation from another entity or operation, and do not necessarily require or imply any actual relationship or order between such entities or operations. Furthermore, the term "comprising" or "including" or any other variations thereof is intended to encompass a non-exclusive inclusion, such that a process, method, article, or device that comprises a plurality of elements includes not only those elements but also other elements that are not listed explicitly or elements that are inherent to such a process, method, item, or device. An element that is defined by the phrase "comprising" or "including", without further limitation to the disclosure, does not exclude the presence of additional elements in the process, method, article, or device.

Embodiments of the disclosure provide a high voltage interlock circuit and a detection method thereof, which can be applied to security protection of high voltage interlock in a new energy vehicle. The high voltage interlock circuit in the embodiments of the disclosure is of a direct current (DC) current type, and a DC current signal is transmitted from a high voltage component module connected to the high voltage interlock circuit. The high voltage interlock circuit and the detection method thereof in the embodiments of the disclosure can alleviate or even avoid fault misjudgment caused by external interference to the high voltage interlock circuit. As a result, the accuracy of fault determination of the high voltage interlock circuit can be improved.

The high voltage interlock circuit provided in the embodiments of the disclosure will be described in detail below with reference to the accompanying drawings.

Figure 1:
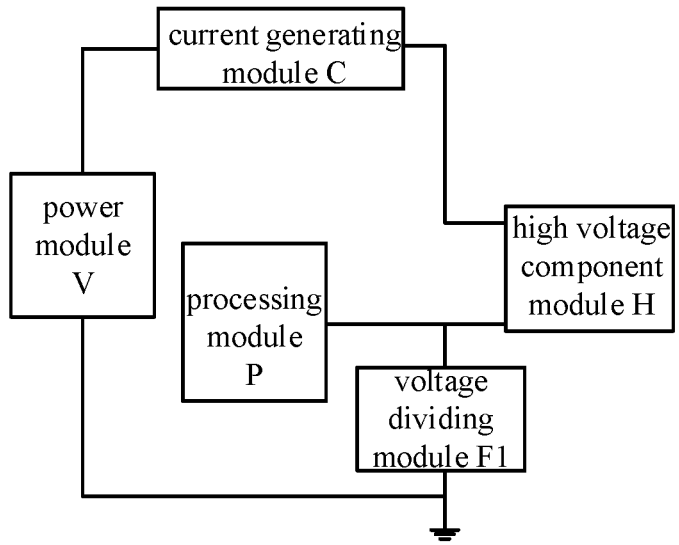
FIG. 1 is a schematic structural diagram of a high voltage interlock circuit according to a first embodiment of the disclosure.

FIG. 1 is a schematic structural diagram of a high voltage interlock circuit according to some embodiments of the disclosure. As shown in FIG. 1, the high voltage interlock circuit may include a power module V, a current generating module C, a voltage dividing module F1, and a processing module P.

A positive electrode of the power module V is connected to one end of the current generating module C. The other end of the current generating module C is connected to a first terminal of the high voltage component module H to inject a constant DC current into the high voltage component module H. One end of the voltage dividing module F1 is connected to a second terminal of the high voltage component module H, and the other end of the voltage dividing module F1 is respectively connected to a negative electrode of the power module V and a power ground. The processing module P is configured to determine a fault of the high voltage component module H based on a first voltage collected from the second terminal of the high voltage component module.

In an embodiment of the disclosure, the high voltage component module H may include a high voltage component or a plurality of high voltage components. For example, the high voltage component(s) may be a connector(s), an MSD(s), or the like, which is not limited herein. If the high voltage component module H includes a plurality of high voltage components, connection manner of the plurality of high voltage components is not specifically limited herein.

In an embodiment of the disclosure, a port connected to the first terminal of the high voltage component module H is a first terminal of the high voltage interlock circuit and is a current output terminal of the high voltage interlock circuit. A port connected to the second terminal of the high voltage component module H is a second terminal of the high voltage interlock circuit and is a current input terminal of the high voltage interlock circuit.

In the embodiment of the disclosure, the power module V, as a power supply for the entire high voltage interlock circuit, may output a high and stable voltage and provide input power to the current generating module C. As an example, the power module V may be a lead acid battery.

As an example, if the first voltage is greater than a first preset threshold, the processing module P may determine that the high voltage component module H is short to the power supply. If the first voltage is less than a second preset threshold, the processing module P may determine that the high voltage component module H is open circuited and/or is short to the power ground.

In an embodiment of the disclosure, as the constant DC current signal input by the current generating module C to the high voltage component module H is not easily affected by external interference signal, a fault of the high voltage component module H may be determined by the voltage collected from the second terminal of the high voltage component module, which can mitigate or even avoid the fault misjudgment caused by external interference to the high voltage interlock circuit. As a result, precision of fault detection for the high voltage component module H by the high voltage interlock circuit can be improved.

Figure 2:
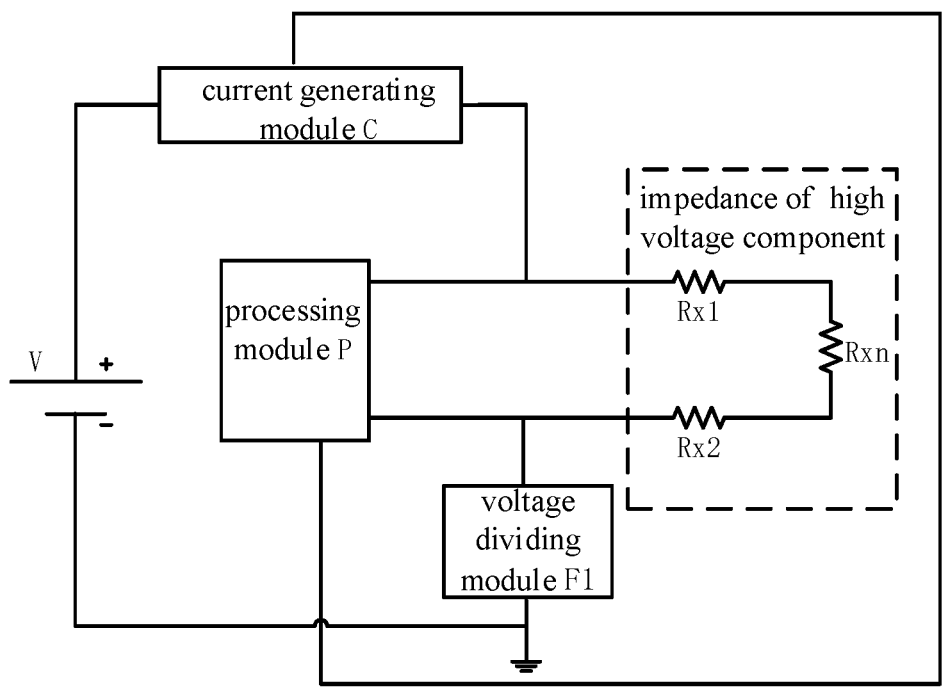
FIG. 2 is a schematic structural diagram of a high voltage interlock circuit according to a second embodiment of the disclosure.

In order to further accurately determine the fault of the high voltage component module H, FIG. 2 is a schematic structural view of a high voltage interlock circuit according to another embodiment of the disclosure. Referring to FIG. 2, the processing module P may also be connected to the first terminal of the high voltage component module H. The processing module P may determine the fault of the high voltage component module H based on the first voltage collected from the second terminal of the high voltage component module H and a second voltage collected from the first terminal of the high voltage component module H.

As an example, if the first voltage is less than a third preset threshold and the second voltage is greater than a fourth preset threshold, the processing module P may determine that the fault of the high voltage component module H is an open circuit.

If the first voltage is greater than a fifth preset threshold and the second voltage is greater than the fifth preset threshold, the processing module P may determine that the fault of the high voltage component module H is a short circuit to the power supply.

If the first voltage is less than a sixth preset threshold and the second voltage is less than the sixth preset threshold, the processing module P may determine that the fault of the high voltage component module H is a short circuit to the power ground.

In an embodiment of the disclosure, the processing module P may determine not only whether there is a fault in the high voltage component module H, but also whether there is a fault in the current generating module C. By determining whether there is a fault in the current generating module C, false detection of the fault of the high voltage component module H due to the fault of the current generating module C can be avoided. The fault of the high voltage component module H may be detected on the basis of determination that there is no fault in the current generating module C, which can further improve the accuracy of fault detection for the high voltage component module H by the high voltage interlock circuit.

In some embodiments of the disclosure, the processing module P may determine whether there is a fault in the current generating module C using the second voltage collected from the first terminal of the high voltage component module H. As an example, if the second voltage meets a first preset condition, it is determined that the current generating module C has no fault. If the second voltage fails to meet the first preset condition, it is determined that there is a fault in the current generating module C. Form of the first preset condition is not limited herein.

Since the second voltage is within a suitable voltage range when the current generating module C operates normally, the first preset condition may be a first preset voltage range. If the second voltage is within the first preset voltage range, it is determined that the current generating module C has no fault. If the second voltage is not within the first preset voltage range, it is determined that there is a fault in the current generating module C. The first preset voltage range may be pre-measured when the current generating module C is operating normally.

In some other embodiments of the disclosure, the processing module P may perform voltage detection on the current generating module C, and determine whether there is a fault in the current generating module C based on a result of the voltage detection and/or the second voltage collected from the first terminal of the high voltage component module H. Referring to FIG. 2, the processing module P is connected to the current generating module C for voltage detection of the current generating module C.

In some examples, the processing module P may be connected to an input terminal of the current generating module C, and the result of the voltage detection is an input voltage of the current generating module C. The processing module P may determine whether there is a fault in the current generating module C based on the second voltage and the input voltage of the current generating module C.

Specifically, if a first difference between the input voltage of the current generating module C and the second voltage meets a second preset condition, the processing module P may determine that the current generating module C has no fault. If the first difference fails to meet the second preset condition, the processing module P may determine that there is a fault in the current generating module C.

Since the voltage difference between the input voltage of the current generating module C and the second voltage is within a suitable voltage range when the current generating module C operates normally, the second preset condition may be a second preset voltage range. Similarly, the second preset voltage range may be pre-measured when the current generating module C is operating normally.

Figure 3:
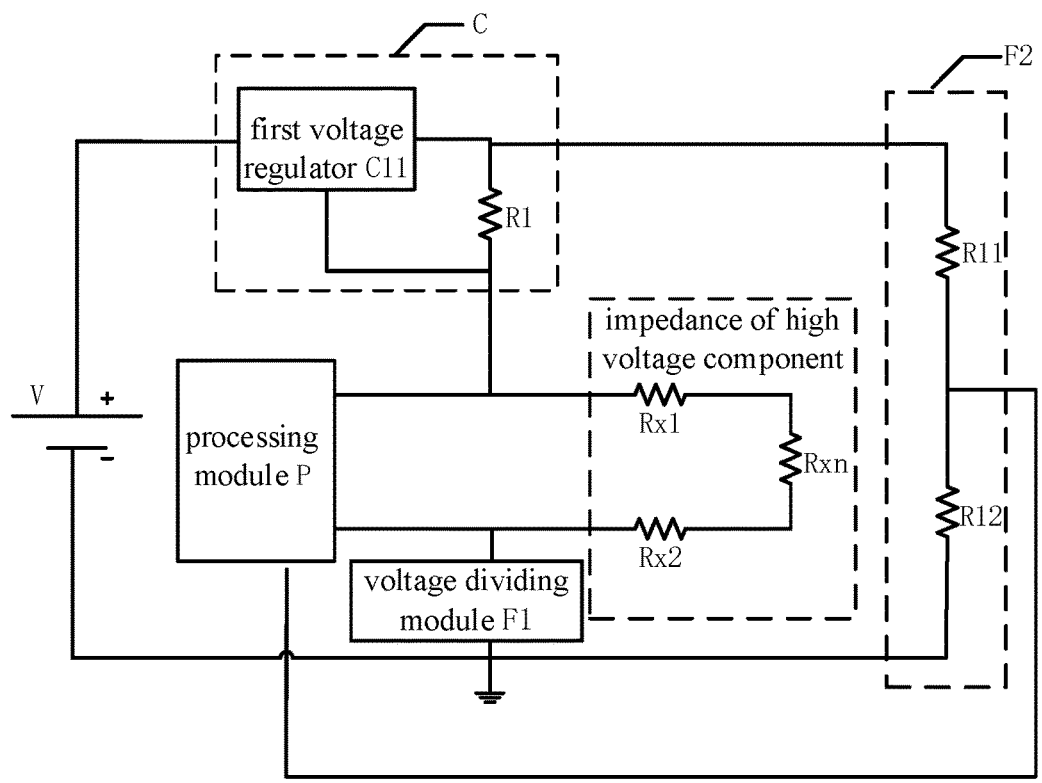
FIG. 3 is a schematic structural diagram of a high voltage interlock circuit according to a third embodiment of the disclosure.

In some embodiments of the disclosure, the processing module P may further determine whether there is a fault the current generating module C based on other voltage detection results of the current generating module C. Since such the fault determination method is related to specific structure of the current generating module C, the current generating module C will be described below in conjunction with a specific example. FIG. 3 is a schematic structural diagram of a high voltage interlock circuit according to an exemplary embodiment of the disclosure.

As shown in FIG. 3, the current generating module C may include a first voltage regulator C11 and a first regulating resistor R1. An input terminal of the first voltage regulator C11 is connected to the positive electrode of the power module V. An output terminal of the first voltage regulator C11 is connected to one end of the first regulating resistor R1. A feedback terminal of the first voltage regulator C11 is connected to the other end of the first regulating resistor R1. The other end of the first regulating resistor R1 is connected to the first terminal of the high voltage component module H.

The first voltage regulator C11 may be configured to supply a constant voltage to the first regulating resistor R1, that is, the voltage difference across the first regulating resistor R1 is constant, so that the DC current flowing through the first regulating resistor R1 is constant. In this way, a constant DC current may be injected into the high voltage component module H. Since the first voltage regulator C11 may supply a constant voltage across the first regulating resistor R1, the current value in the high voltage interlock circuit can be controlled by changing the resistance value of the first regulating resistor R1.

In some examples, the current generating module C may also be a constant current source or a constant current component capable of outputting a constant DC current.

In order to avoid external interference and reduce sampling error, and also in order to improve the accuracy of fault detection for the high voltage component module H, optionally, the current generating module C may output a DC current of 2 mA or more. Moreover, in order to avoid a dangerous accident such as a gas explosion caused by a bare line and a gas, that is, in order to improve safety, the current generating module C may optionally output a DC current of 30 mA or less. Therefore, optionally, the current generating module may output a DC current of 2 mA or more and 30 mA or less. In order to further improve the accuracy of the fault detection for the high voltage component module H, preferably, the current generating module may output a DC current of 10 mA or 20 mA.

In some examples, in order to detect whether there is a fault in the current generating module C, the processing module P may be connected to the output terminal of the first voltage regulator C11, that is, the result of the voltage detection includes an output voltage of the first voltage regulator C11. The processing module P may determine whether there is a fault in the current generating module C based on the output voltage of the first voltage regulator C11 and the second voltage collected from the first terminal of the high voltage component module H.

If a second difference between the output voltage of the first voltage regulator C11 and the second voltage meets a third preset condition, the processing module P may determine that the current generating module C has no fault. If the second difference fails to meet the third preset condition, the processing module P may determine that there is a fault in the current generating module C. As an example, the third preset condition may be a third preset voltage range. Specifically, the third preset voltage range may also be pre-measured when the current generating module C is operating normally. In some other examples, the processing module P may be respectively connected to the input terminal of the first voltage regulator C11 (the connection is not shown in FIG. 3) and the output terminal of the first voltage regulator C11, then the result the voltage detection may include an input voltage of the first voltage regulator C11 and the output voltage of the first voltage regulator C11.

Referring to FIG. 3, an output voltage of the power module V is the input voltage of the first voltage regulator C11. Normally, there is a voltage difference Vdiff1 between the input voltage Vinput1 of the first voltage regulator C11 and the output voltage Voutput1 of the first voltage regulator C11.

The minimum value of Vdiff1 may be labeled as Vdiffmin1. Vdiffmin1 may be obtained based on parameters of the first voltage regulator C11 or empirical data. If the input terminal of the first voltage regulator C11 is short to the output terminal of the first voltage regulator C11, the difference between Vinput1 and Voutput1 will be less than Vdiffmin1.

Therefore, the processing module P may determine whether there is a fault in the current generating module C based on the input voltage and the output voltage of the first voltage regulator C11. If a third difference between the input voltage of the first voltage regulator C11 and the output voltage of the first voltage regulator C11 meets a fourth preset condition, it is determined that the current generating module C has no fault. If the third difference fails to meet the fourth preset condition, it is determined that there is a fault in the current generating module C. As an example, the fourth preset condition requires that the third difference is greater than or equal to the voltage threshold Vdiffmin1.

Specifically, if the third difference obtained by subtracting the output voltage of the first voltage regulator C11 from the input voltage of the first voltage regulator C11 is less than the voltage threshold Vdiffmin1, the processing module P may determine that the input terminal of the first voltage regulator C11 is short to the output terminal of the first voltage regulator C11, that is, the current generating module C is determined to be short circuited. If the third difference is greater than or equal to the voltage threshold Vdiffmin1, the processing module P may determine that the current generating module C has no fault.

It should be noted that, in some examples, the processing module P that determines whether there is a fault in the current generating module C and the processing module P that determines whether there is a fault in the high voltage component module H may be the same processing module P. In some other examples, the processing module P may include two processors, one for determining whether there is a fault in the current generating module C, and the other for determining whether there is a fault in the high voltage component module H. That is, the processor that determines whether there is a fault in the current generating module C and the processor that determines whether there is a fault in the high voltage component module H may be different processors.

In some examples, in order to prevent the output voltage of the first voltage regulator C11 from being higher than a sampling threshold of the processing module P, the high voltage interlock circuit may measures the output voltage of the first voltage regulator C11 using a voltage division method. As an example, referring to FIG. 3, the high voltage interlock circuit may further include a voltage dividing module F2. One end of the voltage dividing module F2 is connected to the output terminal of the first voltage regulator C11, and the other end of the voltage dividing module F2 is respectively connected to the power ground and the power module P.

The voltage division by the voltage dividing module F2 makes the voltage of the other end of the voltage dividing module F2 smaller than the sampling threshold of the processing module P. According to the principle of voltage division, the processing module P may obtain the output voltage of the first voltage regulator C11 based on the voltage of the other end of the voltage dividing module F2 and a resistance value of the voltage dividing module F2.

As an example, referring to FIG. 3, the voltage dividing module F2 may include a resistor R11 and a resistor R12. One end of the resistor R11 is connected to the output terminal of the first voltage regulator C11. The other end of the resistor R11 is respectively connected to one end of the resistor R12 and the processing module P. The other end of the resistor R12 is connected to the power ground.

Assuming that the voltage collected by the processing module P from the other end of the resistor R11 is Vc1, the output voltage Voutput1 of the first voltage regulator C11 can be obtained from the following equation:

$$V_{output1} = Vc1\frac{R11 + R12}{R12} \tag{1}$$

In some examples, the processing module P may also be connected to the input terminal of the first voltage regulator C11 (the connection is not shown in FIG. 3) for collecting the input voltage of the first voltage regulator C11. In order to prevent the input voltage of the first voltage regulator C11 from exceeding the sampling threshold of the processing module P, the input voltage of the first voltage regulator C11 may also be obtained using the voltage division method, which will not be described herein again.

In an embodiment of the disclosure, the processing module P may also control an operating state of the current generating module C. The processing module P may output a control signal to the current generating module C to control the operating state of the current generating module C. The control of the operating state of the current generating module C by the processing module P will be described below with reference to specific examples.

Figure 4:
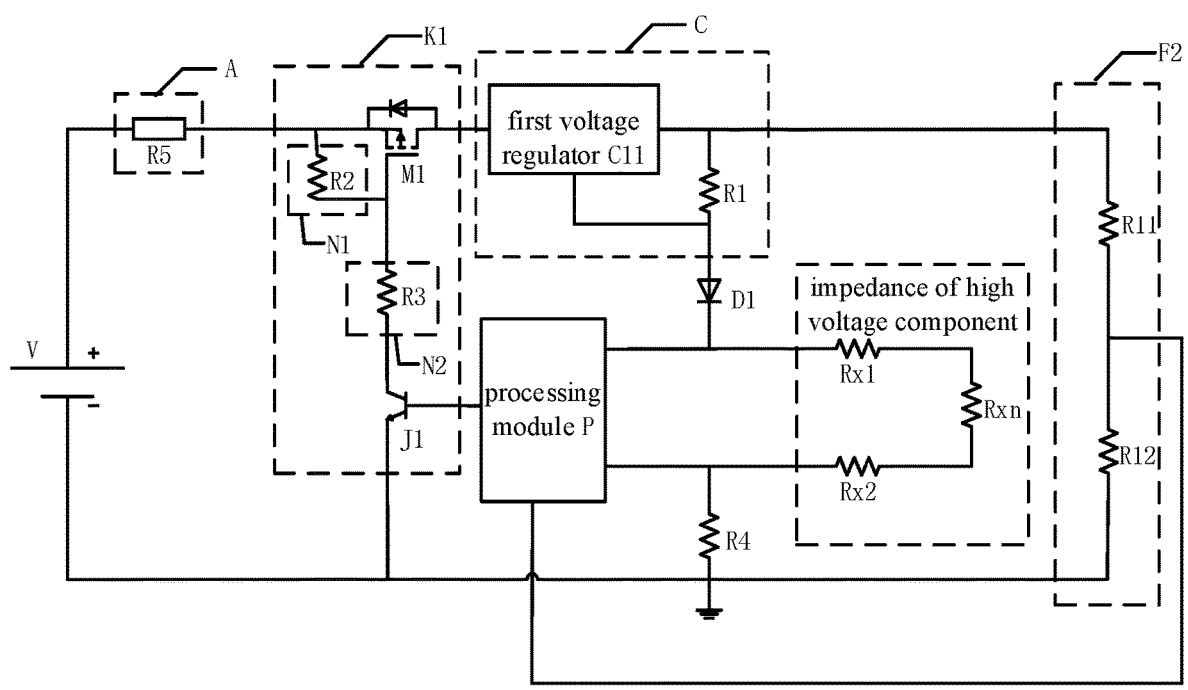
FIG. 4 is a schematic structural diagram of a high voltage interlock circuit according to a fourth embodiment of the disclosure.

FIG. 4 is a schematic structural diagram of a high voltage interlock circuit according to an exemplary embodiment of the disclosure. As shown in FIG. 4, the high voltage interlock circuit may further include a first switch module K1 disposed between the power module V and the current generating module C and connected to the processing module P. The processing module P may be configured to control the on-off of the high voltage interlock circuit and the operating state of the current generating module C through the first switch module K1.

In some examples, the port through which the first switch module K1 is connected to the processing module P is a signal terminal. The processing module P may send a signal to the first switch module K1 through the signal terminal to control the on-off state of the first switch module K1, so as to control the on-off of the high voltage interlock circuit and the operating state of the current generating module C. As a specific example, when the processing module P sends an Off signal to the signal terminal of the first switch module K1, the first switch module K1 is turned off, the high voltage interlock circuit is turned off, and the current generating module C is not operating. When the processing module P sends an On signal to the signal terminal of the first switch module K1, the first switch module K1 is turned on, the high voltage interlock circuit is turned on, and the current generating module C is operating.

Referring to FIG. 4, in some specific examples, the first switch module K1 may include a switch unit M1, a first resistor network N1, a second resistor network N2, and a switch unit J1. A first terminal of the switch unit M1 is respectively connected to the positive electrode of the power module V and one end of the first resistor network N1. A second terminal of the switch unit M1 is connected to the input terminal of the first voltage regulator C11 in the current generating module C. The other end of the first resistor network N1 is respectively connected to a third terminal of the switch unit M1 and one end of the second resistor network N2.

The other end of the second resistor network N2 is connected to the first terminal of the switch unit J1. A second terminal of the switch unit J1 is connected to the processing module P. A third terminal of the switch unit J1 is connected to the power ground.

As an example, the first resistor network N1 may include a resistor R2, and the second resistor network N2 may include a resistor R3. One end of the resistor R2 is connected to the first terminal of the switch unit M1, and the other end of the resistor R2 is connected to the third terminal of the switch unit M1 and one end of the resistor R3, respectively. The other end of the resistor R3 is connected to the first terminal of the switch unit J1.

The second terminal of the switch unit J1 may be used as a signal terminal. When the signal terminal of the switch unit J1 receives the On signal sent by the processing module P, the switch unit J1 is tuned on. When the switch unit J1 is turned on, the switch unit M1 is also turned on, the current generating module C starts to work, and the high voltage interlock circuit is turned on. When the switch unit J1 receives the Off signal sent by the processing module P, the switch unit J1 is turned off, the switch unit M1 is also turned off, the current generating module C stops working, and the high voltage interlock circuit is turned off. That is to say, the processing module P may control the on-off of the high voltage interlock circuit and the operating state of the current generating module C by controlling the operating state of the first switch module K1.

In some examples, the switch unit M1 may be a metal oxide semiconductor (MOS) transistor. The gate of the MOS transistor is connected to one end of the resistor R3, the source of the MOS transistor is respectively connected to the positive electrode of the power module V and the one end of the resistor R2, and the drain of the MOS transistor is connected to the input terminal of the first voltage regulator C11 in the current generating module C. Furthermore, a parasitic diode of the MOS transistor is connected in parallel between the source and the drain of the MOS transistor.

In some examples, the switch unit J1 may be a triode. The base of the switch unit J1 is connected to the processing module P, the collector of the switch unit J1 is connected to the other end of the resistor R3, and the emitter of the switch unit J1 is connected to the power ground.

In an embodiment of the disclosure, each of the switch unit M1 and the switch unit J1 may be any one of a switch such as a MOS transistor, a triode, an insulated gate bipolar transistor (IGBT) chip, or an IGBT module. The specific form of the switch unit M1 and the switch unit J1 is not limited herein. In an embodiment of the disclosure, the processing module P may also detect whether the switch unit M1 is short circuited by using the output voltage of the first voltage regulator C11. Referring to FIG. 4, the processing module P may control the operating state of the high voltage interlock circuit by controlling the switch unit J1. When the high voltage interlock circuit is powered off, if the processing module P may still detect the output voltage of the first voltage regulator C11, it is indicated that the switch unit M1 is short circuited.

Referring to FIG. 4, in some examples, voltage dividing module F1 may include a resistor R4. One end of the resistor R4 is connected to the second terminal of the high voltage component module H, and the other end of the resistor R4 is connected to the power ground and the negative electrode of the power module V respectively.

In order to meet the sampling requirement of the processing module P, the resistance value of the resistor R4 needs to be determined according to the contact resistances $R_{x1}$, $R_{x2}$, . . ., $R_{xn}$ (where n is a positive integer) of the high voltage components in the high voltage component module H, so that the first voltage collected from the second terminal of the high voltage component module H meets the voltage sampling requirement of the processing module P.

Referring to FIG. 4, in some examples, if the output voltage of the power module V is too great, it may be greater than the operating voltage of the current generating module C. Therefore, the high voltage interlock circuit may further include a power regulating module A which is disposed between the power module V and the current generating module C to regulate the input voltage of the current generating module C.

As a specific example, the power regulating module A may include a resistor R5. The input voltage of the current generating module C may be reduced by using the resistor R5, so that the current generating module C may operate normally.

As another example, the power regulating module A may also be a device that increases the input voltage of the current generating module C, such as a DC switching power supply.

In some embodiments of the disclosure, in order to improve the safety of the high voltage interlock circuit, the high voltage interlock circuit may further include a protection sub-circuit disposed between the power regulating module A and the power module V. The protection sub-circuit may include one of the following circuits or any number of the following circuits connected in series: a filter circuit, an anti-reverse circuit, a clamp circuit, and an electro-static discharge (ESD) protection circuit.

In some examples, referring to FIG. 4, an anti-reverse protection device may be further included between the current generating module C and the high voltage component module H for anti-reverse protection. As an example, the anti-reverse protection device may be a diode D1. The anode of the diode D1 is connected to the current generating module C, and the cathode of the diode D1 is connected to the first terminal of the high voltage component module H. Anti-reverse protection can be achieved by utilizing the single-conductivity of the diode.

Specific methods of fault detection for the high voltage component module H by the high voltage interlock circuit will be described below in conjunction with the high voltage interlock circuit of FIG. 4.

Referring to FIG. 4, the voltage across the resistor R1 is a constant value, denoted as V0. The operating current of the high voltage interlock circuit, denoted as $I_1$, can be obtained from the following equation:

$$I_1 = V_0/R1 \qquad (2)$$

When the high voltage interlock circuit operates normally, the voltage collected from the one end of the resistor R4 (the second terminal of the high voltage component module) and the voltage collected from the cathode of the diode D1 (the first terminal of the high voltage component module) are respectively denoted as V1 and V2. V1 and V2 can be calculated from the following equations:

$$V1 = I_1 \times R4 \qquad (3)$$

$$V2 = I_1 \times (R4 + Rx1 + Rx2 + Rxn) \qquad (4)$$

In an embodiment of the disclosure, the processing module P may determine the fault of the high voltage component module H based on the first voltage Vr collected from the second terminal of the high voltage component module, a preset threshold T1, and a preset threshold T2.

The preset threshold T1 may be set based on V1. As an example, the preset threshold T1 is less than V1. That is, the preset threshold T1 is determined based on the DC current $I_1$ of the high voltage interlock circuit and the resistance value of the resistor R4.

The preset threshold T2 may be set based on V2. As an example, the preset threshold T2 is greater than V2. That is, the preset threshold T2 is determined based on the DC current $I_1$ of the high voltage interlock circuit, the resistance value of the resistor R4, and impedance of various high voltage components.

When the high voltage interlock circuit is operating normally, Vr may be within the range of T1 to T2.

However, if the first voltage Vr is less than the preset threshold T1, it may be determined that the high voltage component module H is open circuited and/or is short to the power ground. If the first voltage Vr is greater than the preset threshold T2, it may be determined that the high voltage component module H is short to the power supply.

In order to more accurately distinguish the faults of the high voltage component module H, the processing module P may also determine the fault of the high voltage component module H based on the second voltage Vs collected from the cathode of the diode D1 (i.e., the first terminal of the high voltage component module H), the first voltage Vr collected from the one end of the resistor R4 (i.e., the second terminal of the high voltage component module H), the preset threshold T1, and the preset threshold T2.

When the high voltage interlock circuit operates normally, Vr may be within the range of T1 to T2. Vs may also be within the range of T1 to T2.

Figure 5:
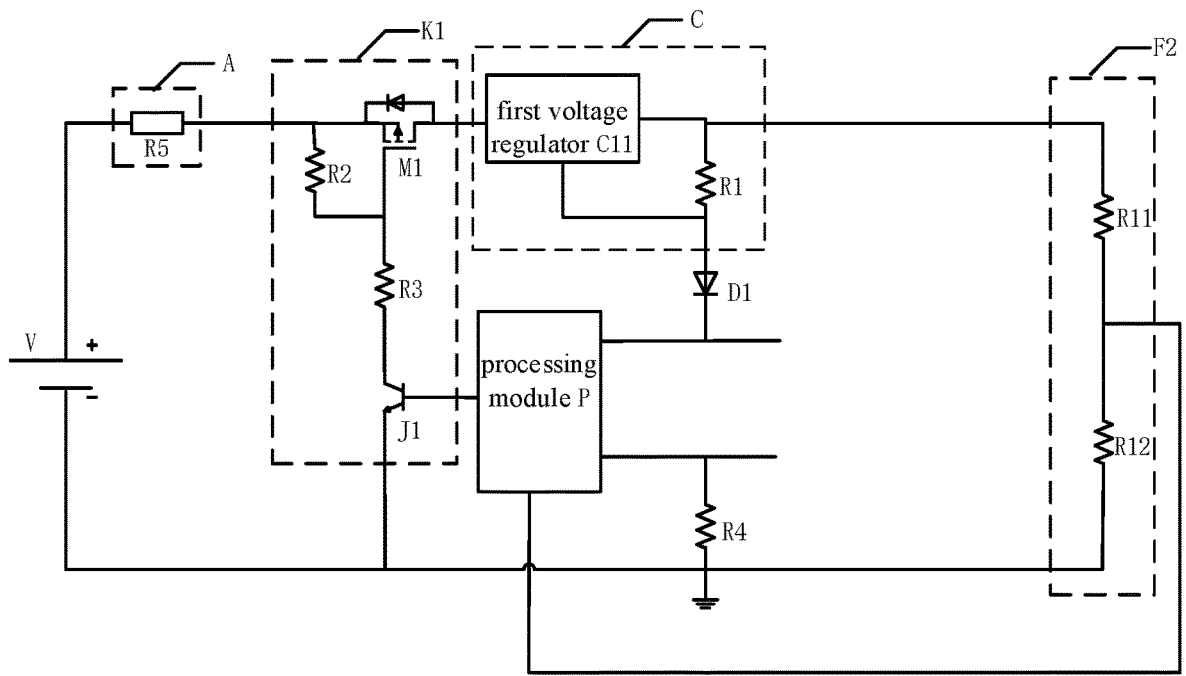
FIG. 5 is a schematic structural diagram of a high voltage component module that is open circuited according to some embodiments of the disclosure.

If Vs is greater than the preset threshold T2 and Vr is less than the preset threshold T1, the processing module P may determine that the high voltage component module H is open circuited. FIG. 5 is a schematic structural diagram of the high voltage component module H that is open circuited.

If Vs is greater than the preset threshold T3 and Vr is also greater than the preset threshold T3, the processing module P may determine that the high voltage component module H is short to the power supply. The preset threshold T3 may be determined based on the DC current, the resistance value of the voltage dividing module F1, and the resistance value of the high voltage component module H.

As an example, the preset threshold T3 is greater than V2. That is, the preset threshold T3 is determined based on the DC current $I_1$ of the high voltage interlock circuit, the resistance value of the resistor R4, and the impedance of various high voltage components.

Figure 6:
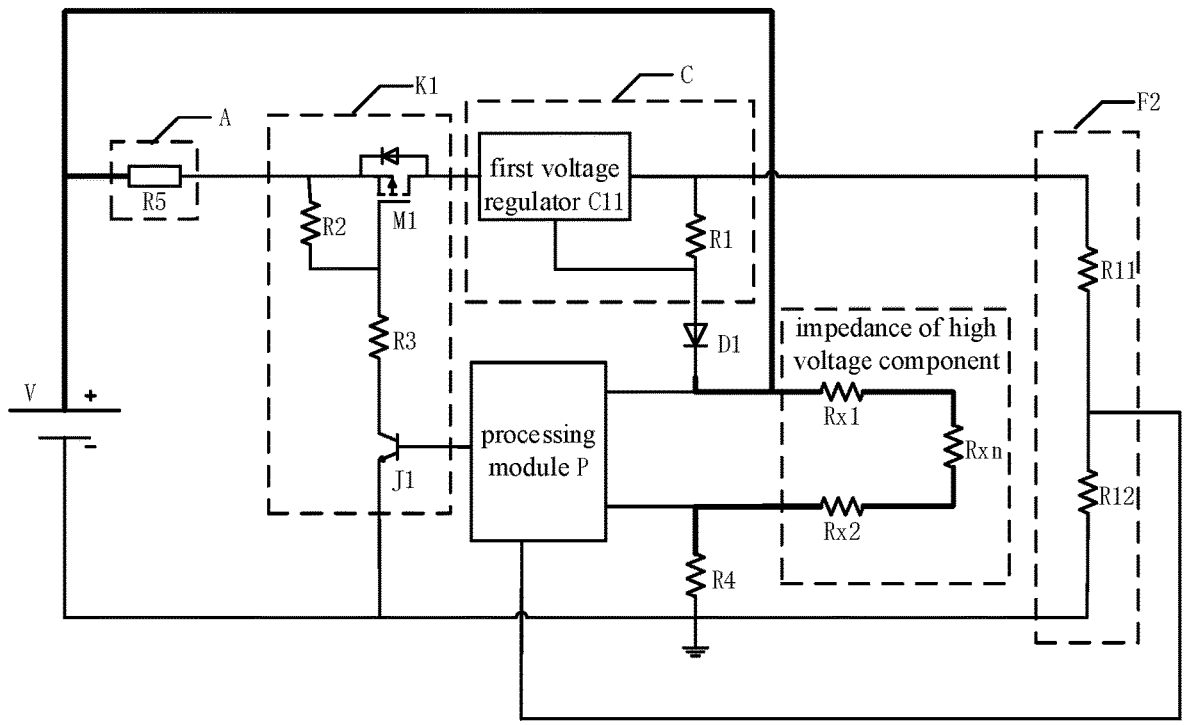
FIG. 6 is a schematic structural diagram of a high voltage component module that is short to power supply according to some other embodiments of the disclosure.

FIG. 6 is a schematic structural diagram of the high voltage component module H that is short to the power supply according to some examples. The thickened line in FIG. 6 is the line that is short to the power supply. FIG. 6 is a schematic structural diagram showing that the high voltage component module H is short to the power supply as the first terminal of the high voltage interlock circuit is short to the power supply. Since the impedance value of various high voltage components is small, if the first terminal of the high voltage interlock circuit is short to the power supply, the voltages at both ends of the high voltage interlock circuit are greater than the preset threshold T3, that is, both ends of the high voltage interlock circuit are at high level. Therefore, the high voltage component module H is short to the power supply.

Figure 7:
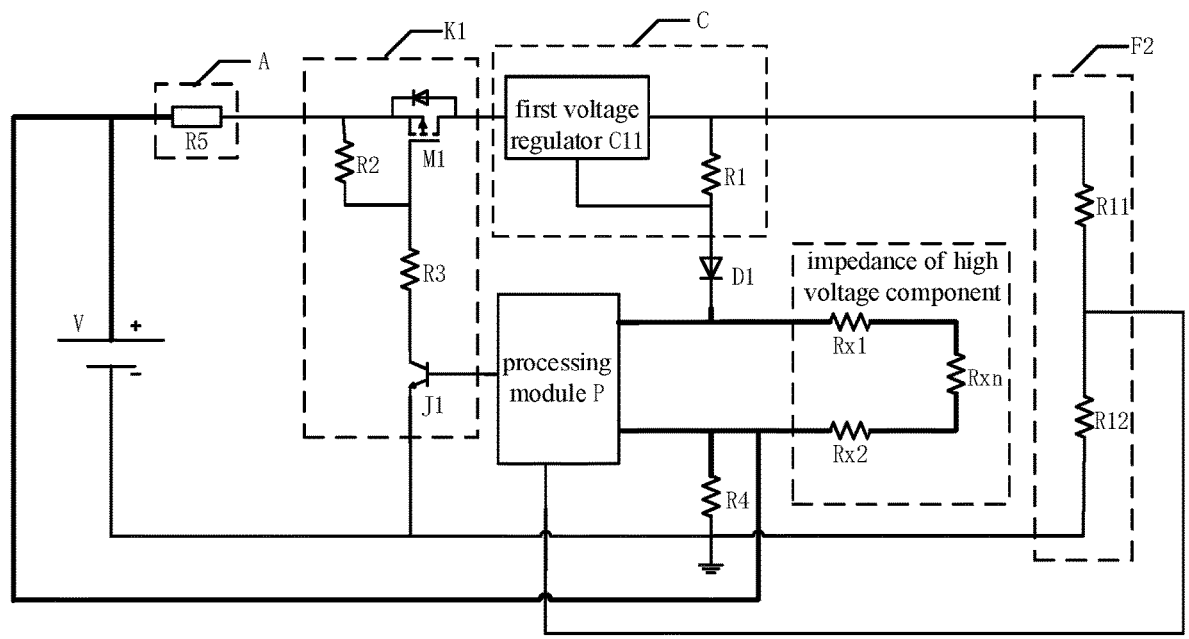
FIG. 7 is a schematic structural diagram of a high voltage component module that is short to power supply according to some other embodiments of the disclosure.

FIG. 7 is a schematic structural diagram of the high voltage component module H that is short to the power supply according to some other examples. The thickened line in FIG. 7 is the line that is short to the power supply. FIG. 7 is a schematic structural diagram showing that the high voltage component module H is short to the power supply as the second terminal of the high voltage interlock circuit is short to the power supply. Similarly, the voltage at both ends of the high voltage interlock circuit are greater than the preset threshold T3, that is, both ends of the high voltage interlock circuit are at high level. That is to say, the high voltage component module H is short to the power supply.

In some examples, if Vs is less than the preset threshold T4 and Vr is less than the preset threshold T4, it is determined that the high voltage component module H is short to the power ground. The preset threshold T4 may be determined based on the DC current and the resistance value of the voltage dividing module F1.

As an example, the preset threshold T4 is less than V1. That is, the preset threshold T4 is determined based on the DC current $I_1$ of the high voltage interlock circuit and the resistance value of the resistor R4.

Figure 8:
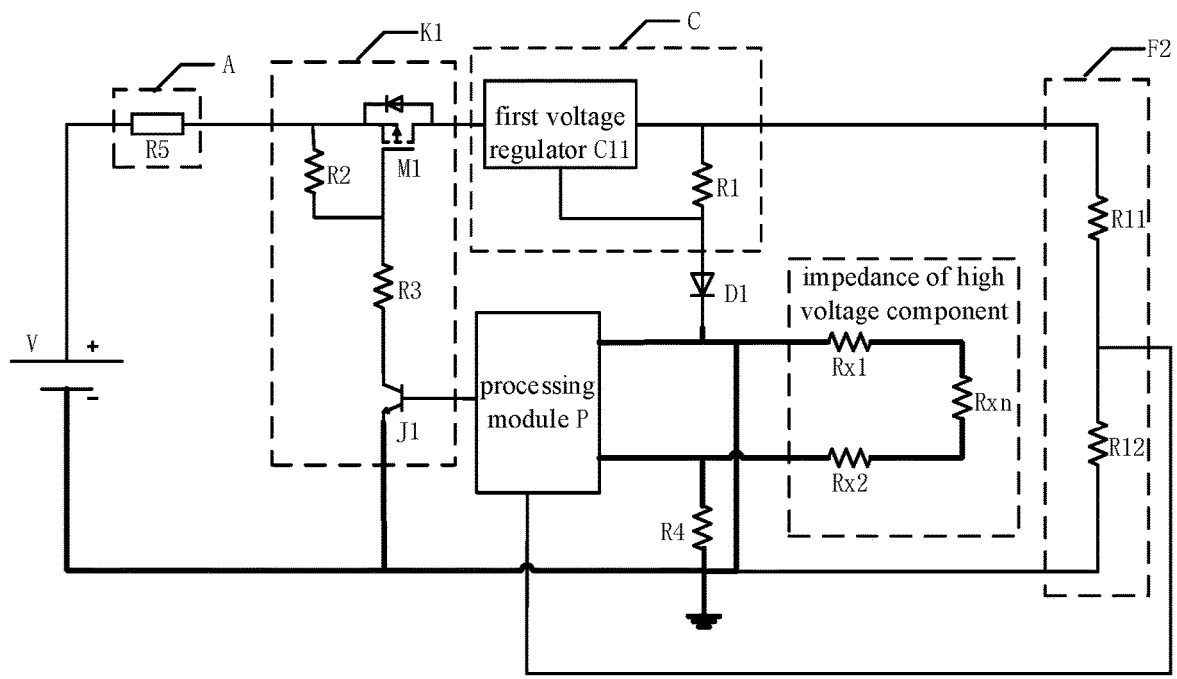
FIG. 8 is a schematic structural diagram of a high voltage component module that is short to power ground according to some embodiments of the disclosure.

FIG. 8 is a schematic structural diagram of the high voltage component module H that is short to the power ground according to some examples. The thickened line in FIG. 8 is the line that is short to the power ground. FIG. 8 is a schematic structural diagram showing that the high voltage component module H is short to the power ground as the first terminal of the high voltage interlock circuit is short to the power ground. Since the impedance value of various high voltage components is small, if the first terminal of the high voltage interlock circuit is short to the power ground, the voltages at both ends of the high voltage interlock circuit are smaller than the preset threshold T4, that is, both ends of the high voltage interlock circuit are at low level. Therefore, the high voltage component module H is short to the power ground.

Figure 9:
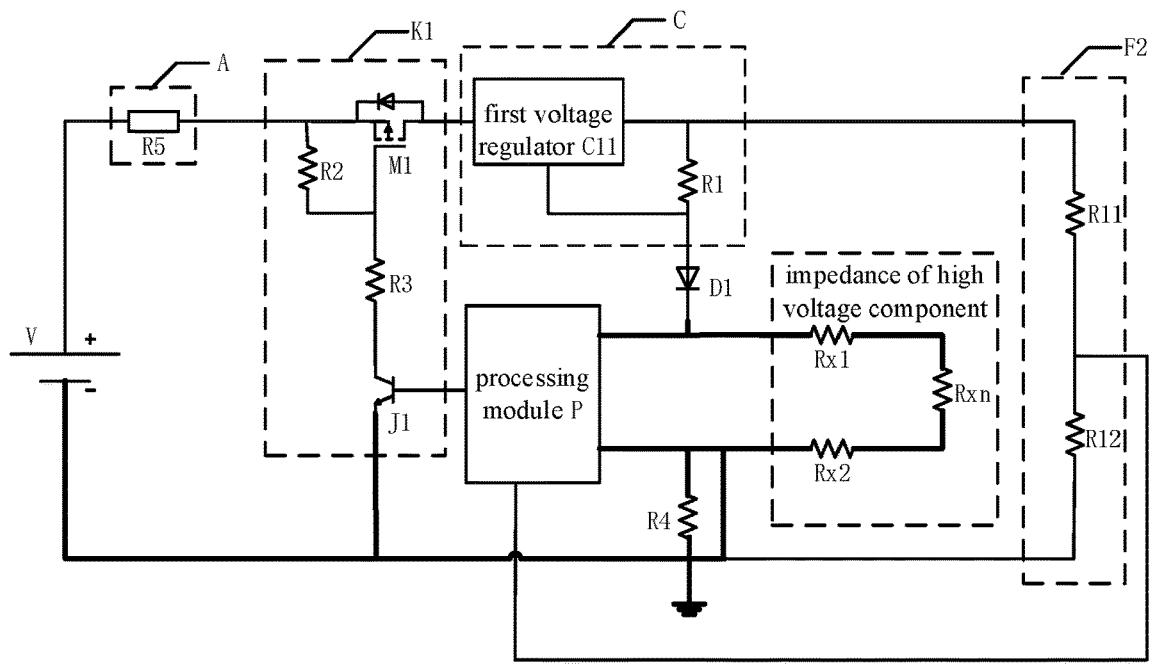
FIG. 9 is a schematic structural diagram of a high voltage component module that is short to power ground according to some other embodiments of the disclosure.

FIG. 9 is a schematic structural diagram of the high voltage component module H that is short to the power ground according to some other examples. The thickened line in FIG. 9 is the line that is short to the power ground. FIG. 9 is a schematic structural diagram showing that the high voltage component module H is short to the power ground as the second terminal of the high voltage interlock circuit is short to the power ground. In FIG. 9, the voltage at both ends of the high voltage interlock circuit are smaller than the preset threshold T4, that is, both ends of the high voltage interlock circuit are at low level. That is to say, the high voltage component module H is short to the power ground.

It should be noted that the processing module P may not only determine whether there is a fault in the high voltage component module H by using the second voltage collected from the first terminal of the high voltage component module H, but also determine whether there is a fault in the current generating module C by using the second voltage. If determination conditions for fault determination of the two modules are distinguished, it is possible to distinguish which module has a fault.

In some examples, the preset threshold T2 may be equal to the preset threshold T3, and the preset threshold T1 may be equal to the preset threshold T4. Table 1 shows relationship between the fault of the high voltage component module H and the voltages at both ends of the high voltage component module H with respect to determination condition.

TABLE 1

|  | Voltage at first terminal | Voltage at second terminal |
| --- | --- | --- |
| Normal | T1~T2 | T1~T2 |
| high voltage component module H open circuited | >T2 | <T1 |
| high voltage component module H short to power supply | >T2 | >T2 |
| high voltage component module H short to power ground | <T1 | <T1 |

It should be noted that the voltages at both ends of the high voltage component module H are respectively the voltages at both ends of the high voltage interlock circuit. That is to say, if the voltages at both ends of the high voltage interlock circuit are within the range of T1 to T2, the high voltage component module H is operating normally. If the voltage at the first terminal of the high voltage interlock circuit is greater than the preset threshold T2 and the voltage at the second terminal of the high voltage interlock circuit is less than the preset threshold T1, it is determined that the high voltage component module H is open circuited.

If the voltage at the first terminal of the high voltage interlock circuit and the voltage at the second terminal of the high voltage interlock circuit are both greater than the preset threshold T2, it may be determined that the high voltage interlock circuit is short to the power supply at both ends. If the voltage at the first terminal of the high voltage interlock circuit and the voltage at the second terminal of the high voltage interlock circuit are both less than the preset threshold T1, it may be determined that the high voltage interlock circuit is short to the power ground at both ends.

Figure 10:
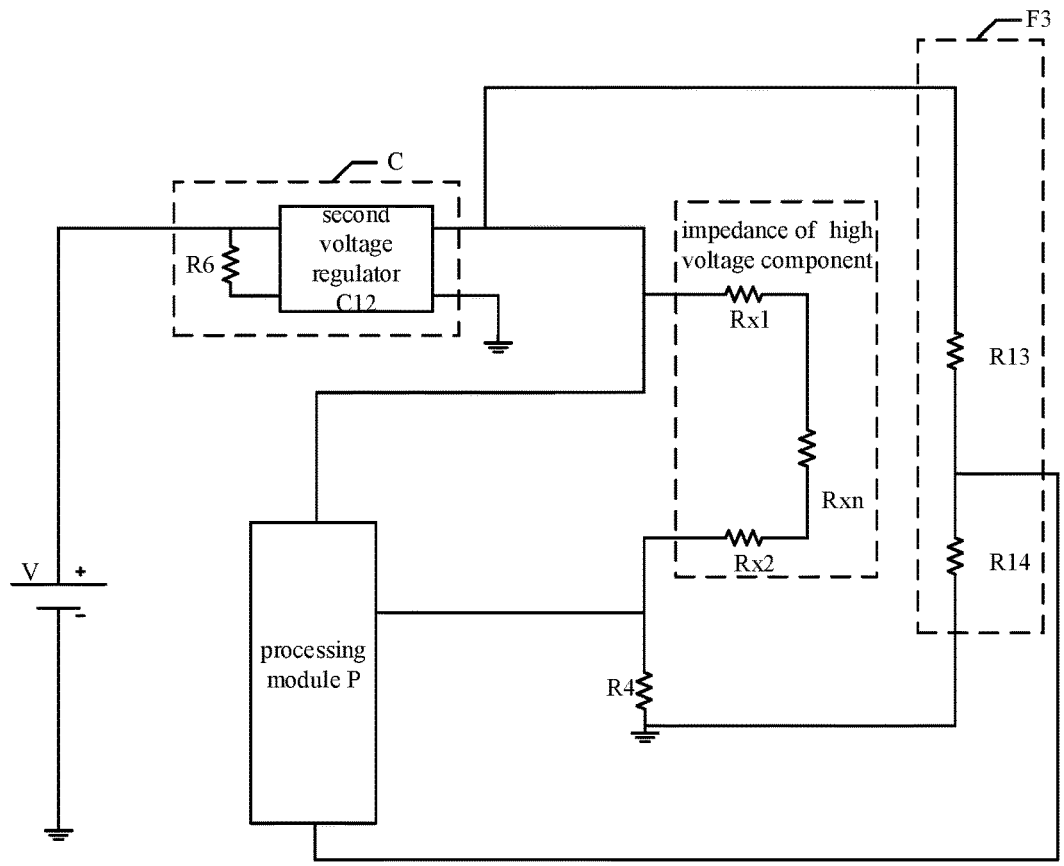
FIG. 10 is a schematic structural diagram of a high voltage interlock circuit according to a fifth embodiment of the disclosure.

FIG. 10 is a schematic structural diagram of a high voltage interlock circuit according to still other embodiments of the disclosure. FIG. 10 is different from FIG. 3 in the internal structure of the current generating module C.

Referring to FIG. 10, the current generating module C may include a second voltage regulator C12 and a second regulating resistor R6. An input terminal of the second voltage regulator C12 is respectively connected to the positive electrode of the power module V and one end of the second regulating resistor R6. A feedback terminal of the second voltage regulator C12 is connected to the other end of the second regulating resistor R6. An output terminal of the second voltage regulator C12 is connected to the first terminal of the high voltage component module H.

It should be noted that the second voltage regulator C12 may further include a signal terminal. When the signal terminal is connected to the ground, the second voltage regulator C12 operates normally.

The second voltage regulator C12 may be configured to supply a constant voltage to the second regulating resistor R6, that is, the voltage difference across the second regulating resistor R6 is constant, so that the DC current flowing through the second regulating resistor R6 is constant. In this way, constant DC current may be injected into the high voltage component module H. Since the second voltage regulator C12 may supply a constant voltage across the second regulating resistor R6, the current value of the high voltage interlock circuit may be controlled by changing the resistance value of the second regulating resistor R6.

Similar to the first voltage regulator C11, in some examples, the processing module P may be connected to the output terminal of the second voltage regulator C12 for voltage detection of the current generating module C. Then, the result of the voltage detection of the current generating module C may include the output voltage of the second voltage regulator C12. The processing module P may determine whether there is a fault in the current generating module C based on the output voltage of the second voltage regulator C12 and the second voltage collected from the first terminal of the high voltage component module H.

If a fourth difference between the output voltage of the second voltage regulator C12 and the second voltage meets a fifth preset condition, it may be determined that the current generating module C has no fault. If the fourth difference fails to meet the fifth preset condition, it may be determined that there is a fault in the current generating module C. As an example, the fifth preset condition may be a fourth preset voltage range.

In some other examples, the processing module P may be respectively connected to an input terminal of the second voltage regulator C12 (the connection is not shown in FIG. 10) and the output terminal of the second voltage regulator C12, and the result of the voltage detection may include the input voltage of the second voltage regulator C12 and the output voltage of the second voltage regulator C12.

The processing module P may determine whether there is a fault in the current generating module C based on the input voltage of the second voltage regulator C12 and the output voltage of the second voltage regulator C12. If a fifth difference between the input voltage of the second voltage regulator C12 and the output voltage of the second voltage regulator C12 meets a sixth preset condition, it may be determined that the current generating module C has no fault. If the fifth difference fails to meet the sixth preset condition, it may be determined that there is a fault in the current generating module C. Similar to the first voltage regulator C11, in the normal operating state, the difference between the input voltage of the second voltage regulator C12 and the output voltage of the second voltage regulator C12 has a minimum value, which is the voltage threshold Vdiffmin2. As an example, the sixth preset condition requires that the fifth difference is greater than or equal to the voltage threshold Vdiffmin2. Therefore, the processing module P may determine whether there is a fault in the current generating module C based on the voltage threshold Vdiffmin2 and the second voltage difference obtained by subtracting the output voltage of the second voltage regulator C12 from the input voltage of the second voltage regulator C12.

If the fifth difference is greater than or equal to the voltage threshold Vdiffmin2, it may be determined that the current generating module C has no fault. If the fifth difference is less than the voltage threshold Vdiffmin2, the processing module P may determine that the input terminal and the output terminal of the second voltage regulator C12 are short circuited, that is, the processing module P may determine that the current generating module C is short circuited.

Similarly, in order to prevent the output voltage of the second voltage regulator C12 from being higher than the sampling threshold of the processing module P, the high voltage interlock circuit may also measure the output voltage of the second voltage regulator C12 by using the voltage division method. As an example, referring to FIG. 10, the high voltage interlock circuit may further include a voltage dividing module F3. One end of the voltage dividing module F3 is connected to the output terminal of the second voltage regulator C12, and the other end of the voltage dividing module F3 is respectively connected to the power ground and processing module P.

The processing module P may obtain the output voltage of the second voltage regulator C12 based on the voltage of the other end of the voltage dividing module F3 and the resistance value of the voltage dividing module F3.

As a specific example, referring to FIG. 10, the voltage dividing module F3 may include a resistor R13 and a resistor R14. One end of the resistor R13 is connected to the output terminal of the second voltage regulator C12. The other end of the resistor R13 is respectively connected to one end of the resistor R14 and the processing module P. The other end of the resistor R14 is connected to the power ground.

With the calculation method similar to the equation (1), the output voltage of the second voltage regulator C12 may be obtained from the voltage collected from the other end of the resistor R13.

In some examples, the processing module P may also be connected to the input terminal of the second voltage regulator C12 (this connection is not shown in FIG. 10) for collecting the input voltage of the second voltage regulator C12. In order to prevent the input voltage of the second voltage regulator C12 from exceeding the sampling threshold of the processing module P, the input voltage of the second voltage regulator C12 may also be detected using the voltage division method, which will not be detailed herein again.

Figure 11:
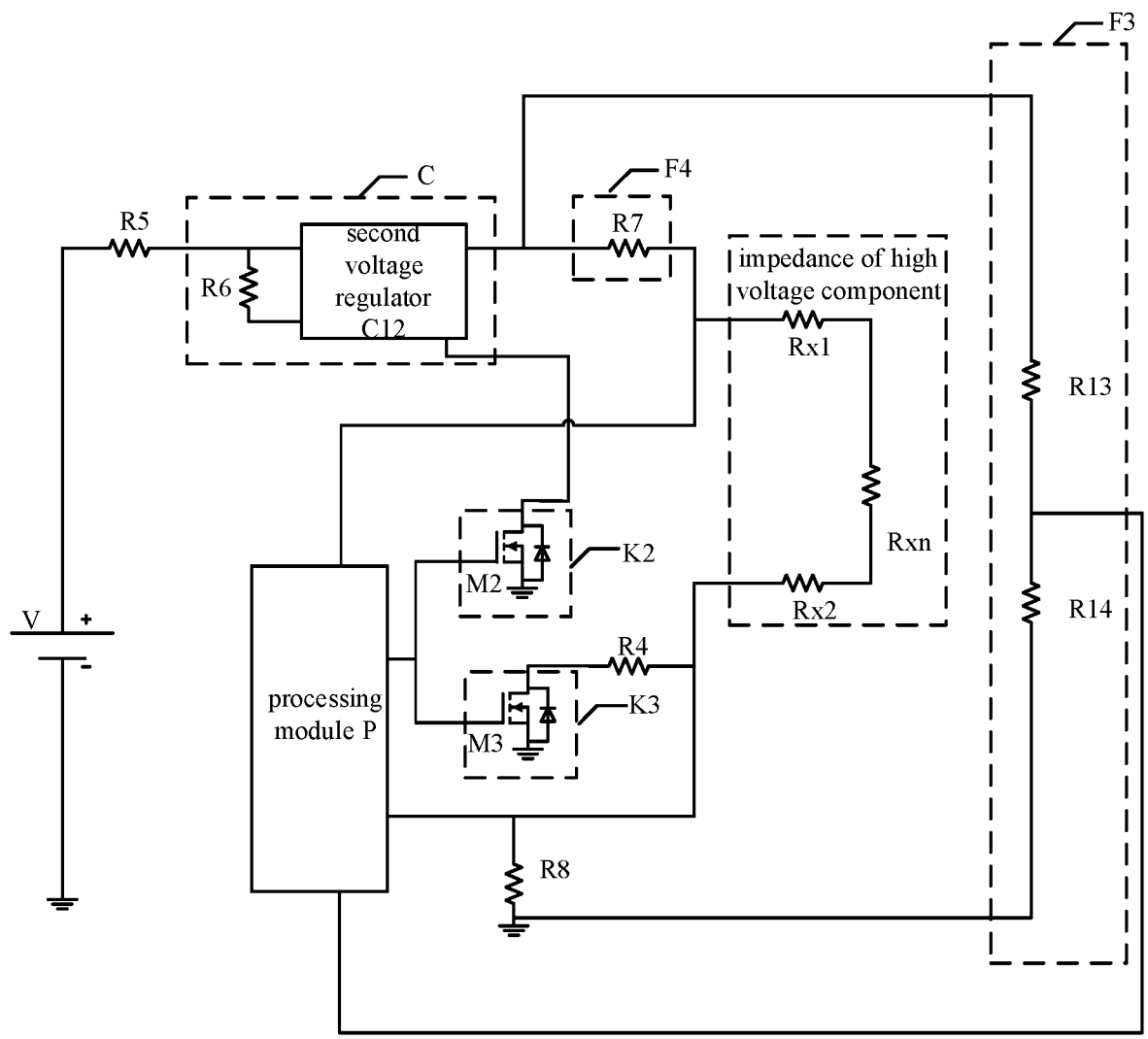
FIG. 11 is a schematic structural diagram of a high voltage interlock circuit according to a sixth embodiment of the disclosure.

The control of the operating state of the current generating module C in FIG. 10 by the processing module P will be described below with reference to a specific example. FIG. 11 is a schematic structural diagram of a high voltage interlock circuit according to an exemplary embodiment of the disclosure. Referring to FIG. 11, the high voltage interlock circuit may include a second switch module K2. A first terminal of the second switch module K2 is connected to the current generating module C, a second terminal of the second switch module K2 is connected to the processing module P, and a third terminal of the second switch module K2 is connected to the power ground.

The second terminal of the second switch module K2 may be a signal terminal. The processing module P may be connected to the signal terminal of the second switch module K2, and then send an On signal or an Off signal to the second switch module K2 to control the On-Off of the second switch module K2. Since the first terminal of the second switch module K2 is connected to the signal terminal of the second voltage regulator C12 in the current generating module C, if the second switch module K2 is turned on, the second voltage regulator C12 is grounded. If the second voltage regulator C12 is grounded, the current generating module C starts to operate. When the second switch module K2 is turned off, the current generating module C stops operating.

In some examples, the high voltage interlock circuit may further include a third switch module K3. A first terminal of the third switch module K3 is connected to the voltage dividing module F1, a second terminal of the third switch module K3 is connected to the processing module P, and a third terminal of the third switch module K3 is connected to the power ground.

The second terminal of the third switch module K3 may be a signal terminal. The processing module P may be connected to the signal terminal of the third switch module K3, and then send an On signal or an Off signal to the third switch module K3 to control the On-Off of the third switch module K3. Since the first terminal of the third switch module K3 is connected to the voltage dividing module F1, if the third off module is turned on, the high voltage interlock circuit is turned on. If the third switch module K3 is turned off, the high voltage interlock circuit is turned off.

That is to say, the processing module P may control the operating state of the current generating module C by using the second switch module K2, and may also control the On-Off of the high voltage interlock circuit by using the third switch module K3.

As a specific example, the second switch module K2 may be a MOS transistor M2.

The gate of the MOS transistor M2 is connected to the processing module P, the drain of the MOS transistor M2 is connected to the signal terminal of the second voltage regulator C12, and the source of the MOS transistor M2 is connected to the power ground. Further, a parasitic diode of the MOS transistor is connected in parallel between the source and the drain of the MOS transistor M2.

As a specific example, the third switch module K3 may be a MOS transistor M3. The gate of the MOS transistor M3 is connected to the processing module P, the drain of the MOS transistor M3 is connected to the other end of the resistor R4, and the source of the MOS transistor M3 is connected to the power ground. Further, a parasitic diode of the MOS transistor is connected in parallel between the source and the drain of the MOS transistor M3. The specific form of the second switch module K2 and the third switch module K3 is not limited herein.

Referring to FIG. 11, the high voltage interlock circuit may further include a voltage dividing module F4. One end of the voltage dividing module F4 is connected to the output terminal of the second voltage regulator C12, and the other end of the voltage dividing module F4 is connected to the first terminal of the high voltage component module H. The voltage at the first terminal of the high voltage interlock circuit can be reduced by the voltage dividing module F4, so as to meet the sampling threshold of the processing module P. As a result, the sampling precision can be improved, and the accuracy of fault detection for the high voltage component module H can be further improved.

Referring to FIG. 11, the voltage dividing module F4 may include a resistor R7. One end of the resistor R7 is connected to the second voltage regulator C12, and the other end of the resistor R7 is connected to the first terminal of the high voltage component module H. The resistance values of the resistor R7 and the resistor R4 may be determined based on the sampling threshold of the processing module P and the impedance values Rx1 to Rxn of the high voltage components in the high voltage component module H.

In an embodiment of the disclosure, the voltage signal collected by the processing module P from the high voltage interlock circuit is an analog signal. The processing module P needs to convert the collected analog signal into a digital signal that is easier to store and process, for further processing.

Figure 12:
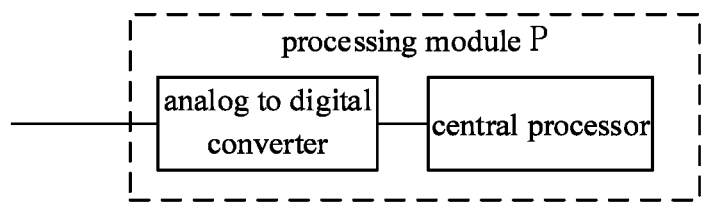
FIG. 12 is a schematic structural diagram of a processing module according to some embodiments of the disclosure.

In some examples, the processing module P may include an analog to digital converter and a central processor. An input port of the analog signal is connected to the analog to digital converter. The analog to digital converter may convert the voltage signal collected in the high voltage interlock circuit into the digital signal. The central processor may determine, based on the digital signal output from the analog to digital converter, the fault of the high voltage component module H, the fault of the high voltage interlock circuit itself, or the fault of the current generating module C. As shown in FIG. 12, the analog to digital converter is connected to the central processor, that is, the analog to digital converter is disposed outside the central processor.

Figure 13:
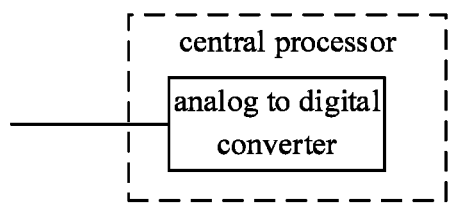
FIG. 13 is a schematic structural diagram of a processing module according to some other embodiments of the disclosure.

In some examples, the processing module P may be a central processor that includes an analog to digital converter, i.e., the analog to digital converter is disposed inside the central processor, as shown in FIG. 13.

That is to say, the analog-to-digital converter may be disposed inside the central processor or outside the central processor, which is not limited herein.

Referring to FIG. 11, the high voltage interlock circuit may further include a pull-down resistor R8. One end of the pull-down resistor R8 is respectively connected to the processing module P and one end of the voltage dividing module F1, and the other end of the pull-down resistor R8 is connected to the power ground. The pull-down resistor R8 may be used to provide a pull-down resistor to the analog-to-digital converter of the processing module P when the high voltage interlock circuit is not operating, that is, when both the second switch module K2 and the third switch module K3 are turned off, so that the processing module P may obtain a stable low level.

Referring to FIG. 11, a power regulating module A may also be provided between the power module V and the input terminal of the second voltage regulator C12. For example, the power regulating module A may include a resistor R5. A protection circuit may also be disposed between the power module V and the power regulating module A, which will not be detailed herein.

In some embodiments, an anti-reverse protection device may also be disposed between the output terminal of the second voltage regulator C12 and the high voltage component module H, which will not be detailed herein.

A method of fault detection for the high voltage component module H by the high voltage interlock circuit will be described with reference to the high voltage interlock circuit of FIG. 11 below.

Referring to FIG. 11, the voltage across resistor R6 is a fixed value, denoted as V0', and the operating current of the high voltage interlock circuit is denoted as $I_2$, then the following equation can be obtained:

$$I_2 = V_0'/R6 \tag{5}$$

When the high voltage interlock circuit is operating normally, the voltage collected from the one end of the resistor R4 (the second terminal of the high voltage component module H) and the voltage collected from the other end of the resistor R7 (the first terminal of the high voltage component module H) may be denoted as V1' and V2', respectively. V1' and V2' may be calculated using the following equations, respectively:

$$V1' = I_2 \times R4 \tag{6}$$

$$V2' = I_2 \times (R4 + Rx1 + Rx2 + Rxn) \tag{7}$$

Similarly, the processing module P may determine whether there is a fault in the high voltage component module H based on the voltage Vr' collected from the one end of the resistor R4, the preset threshold T5, and the preset threshold T6.

The preset threshold T5 may be set based on V1'. As an example, the preset threshold T5 is less than V1'. That is to say, the preset threshold T5 may be determined based on the DC current $I_2$ of the high voltage interlock circuit and the resistance value of the resistor R4. The preset threshold T6 may be set based on V2'. As an example, the preset threshold T6 is greater than V2'. That is, the preset threshold T6 may be determined based on the DC current $I_2$ of the high voltage interlock circuit, the resistance value of the resistor R4, and the impedance values of the high voltage components. When the high voltage interlock circuit is operating normally, Vr' is within the range of T5 to T6.

However, if Vr' is less than the preset threshold T5, it may be determined that the high voltage component module H is open circuited and/or is short to the power ground. If Vr' is greater than the preset threshold T6, it may be determined that the high voltage component module H is short to the power supply.

In order to more accurately distinguish the fault of the high voltage component module H, the processing module P may also determine the fault of the high voltage component module H based on the second voltage Vs' collected from the other end of the resistor R7, the voltage Vr' collected from the one end of the resistor R4, the preset threshold T5, and the preset threshold T6.

Figure 14:
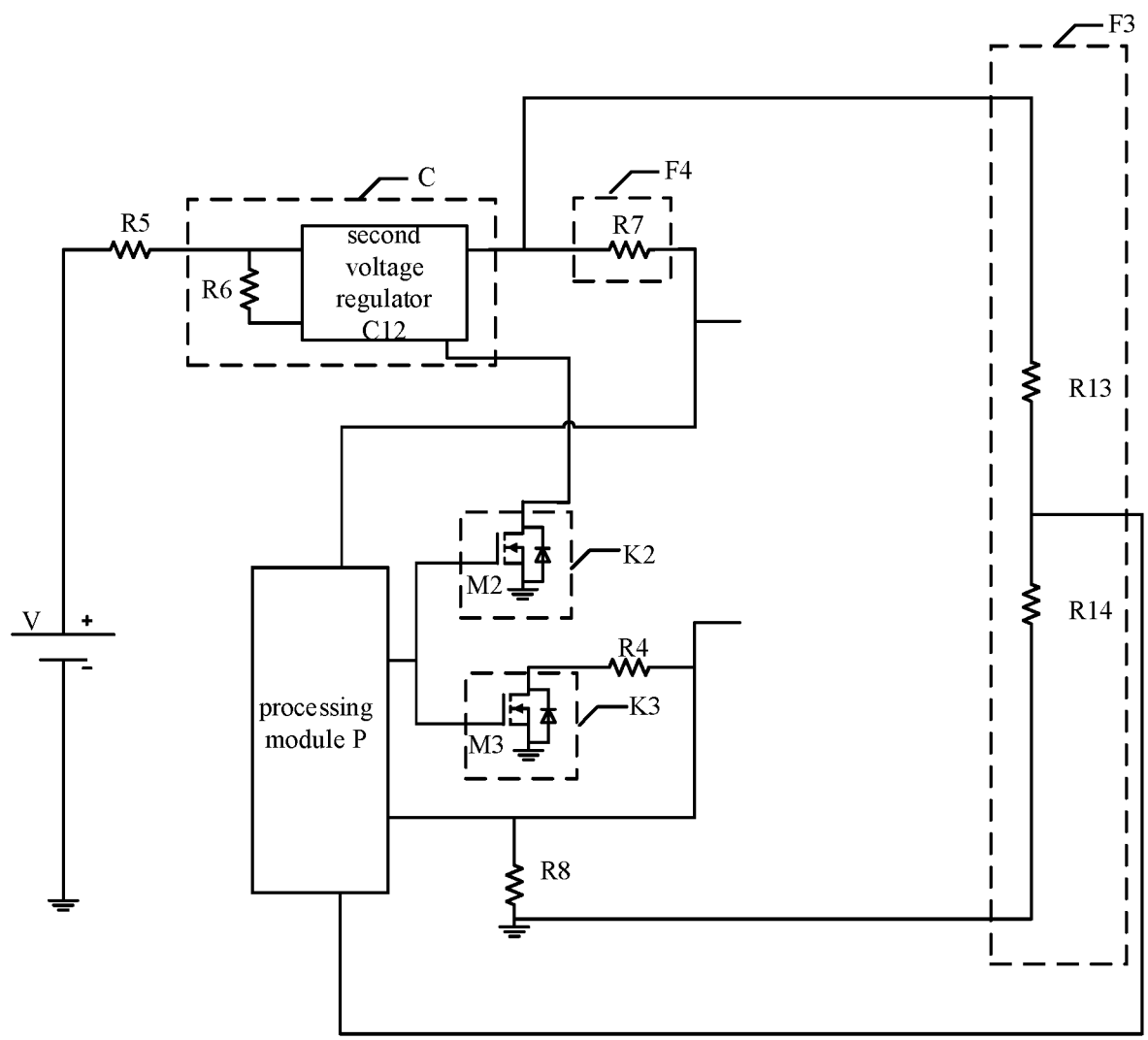
FIG. 14 is a schematic structural diagram of a high voltage component module that is open circuited according to some other embodiments of the disclosure.

If Vs' is greater than the preset threshold T6 and Vr' is less than the preset threshold T5, the processing module P may determine that the high voltage component module H is open circuited. FIG. 14 is a schematic structural diagram of the high voltage component module H that is open circuited.

As an example, if both Vs' and Vr' are greater than a preset threshold T7 which is greater than VT, the processing module P may determine that the high voltage component module H is short to the power supply.

Figure 15:
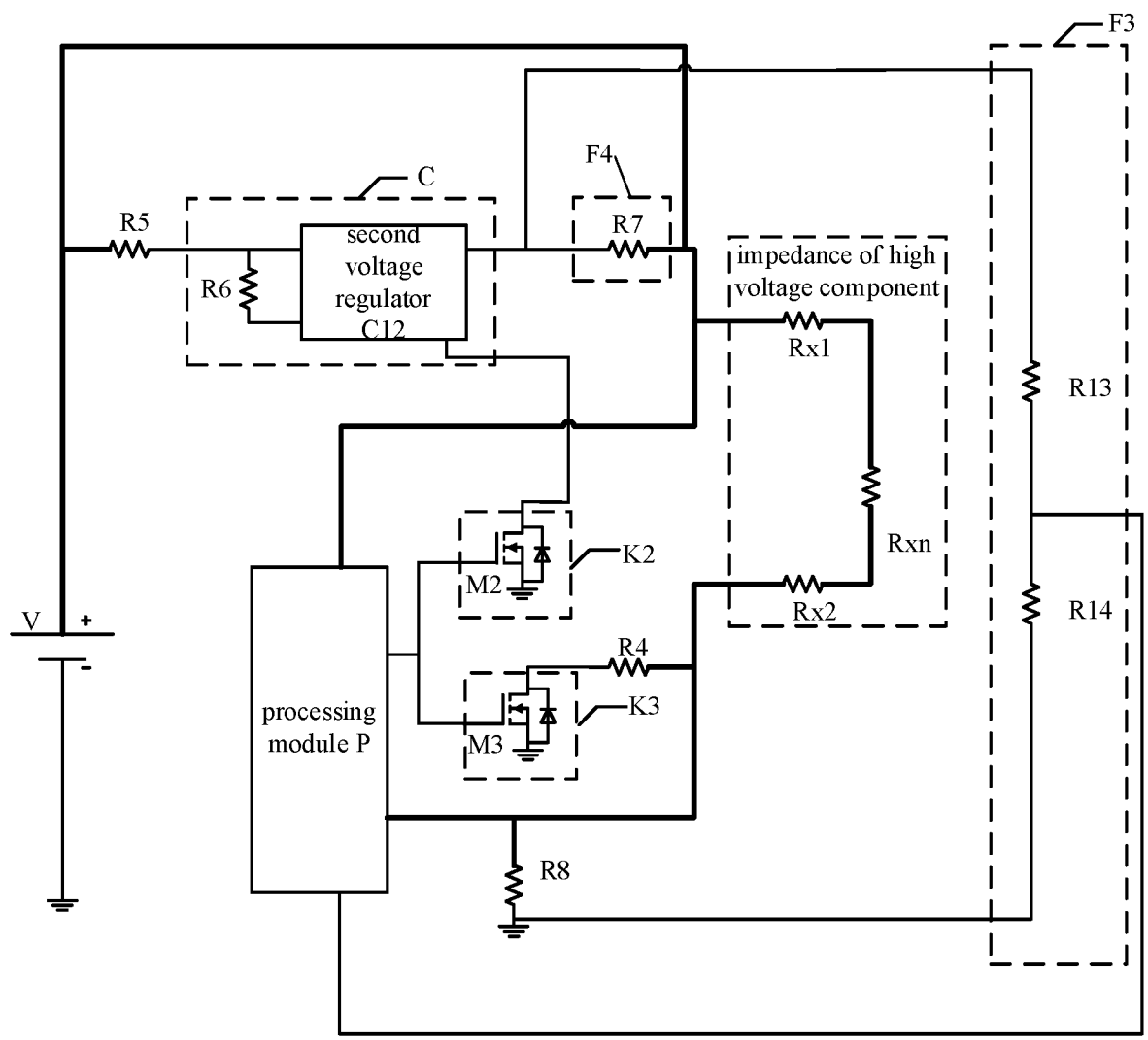
FIG. 15 is a schematic structural diagram of a high voltage component module that is short to power supply according to still some other embodiments of the disclosure.

FIG. 15 is a schematic structural diagram of the high voltage component module H that is short to the power supply according to some examples. The thickened line in FIG. 15 is the line that is short to the power module V. The high voltage interlock circuit is at high level at both ends. FIG. 15 is a schematic structural diagram showing that the high voltage component module H is short to the power supply as the first terminal of the high voltage interlock circuit is short to the power supply.

Figure 16:
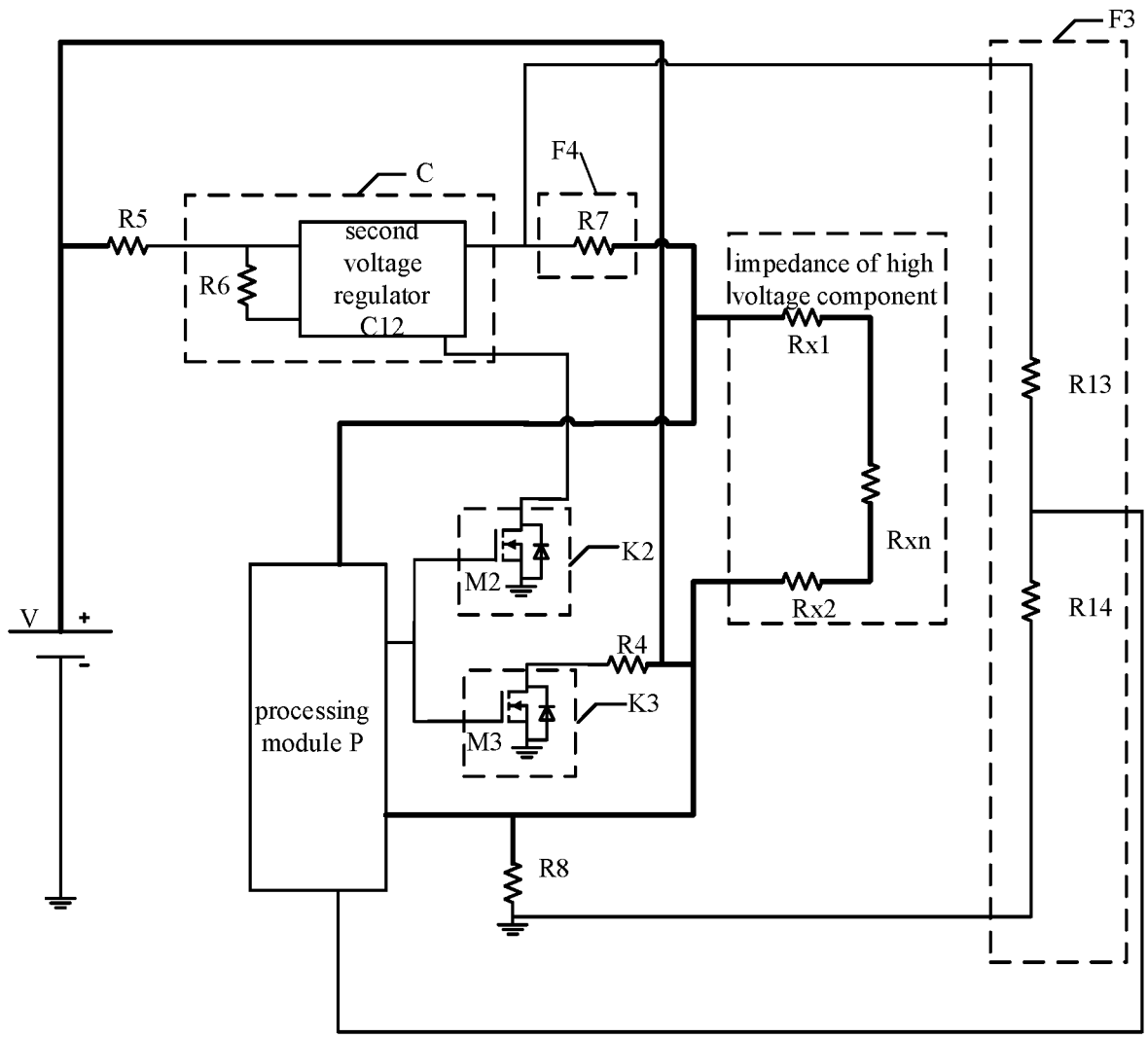
FIG. 16 is a schematic structural diagram of a high voltage component module that is short to power supply according to yet some other embodiments of the disclosure.

FIG. 16 is a schematic structural diagram of the high voltage component module H that is short to the power supply according to some other examples. The thickened line in FIG. 16 is the line that is short to the power module V. The high voltage interlock circuit is at high level at both ends. FIG. 16 is a schematic structural diagram showing that the high voltage component module H is short to the power supply as the second terminal of the high voltage interlock circuit is short to the power supply.

If both Vs' and Vr' are smaller than a preset threshold T8 which is smaller than V1', the processing module P may determine that the high voltage component module H is short to the power ground.

Figure 17:
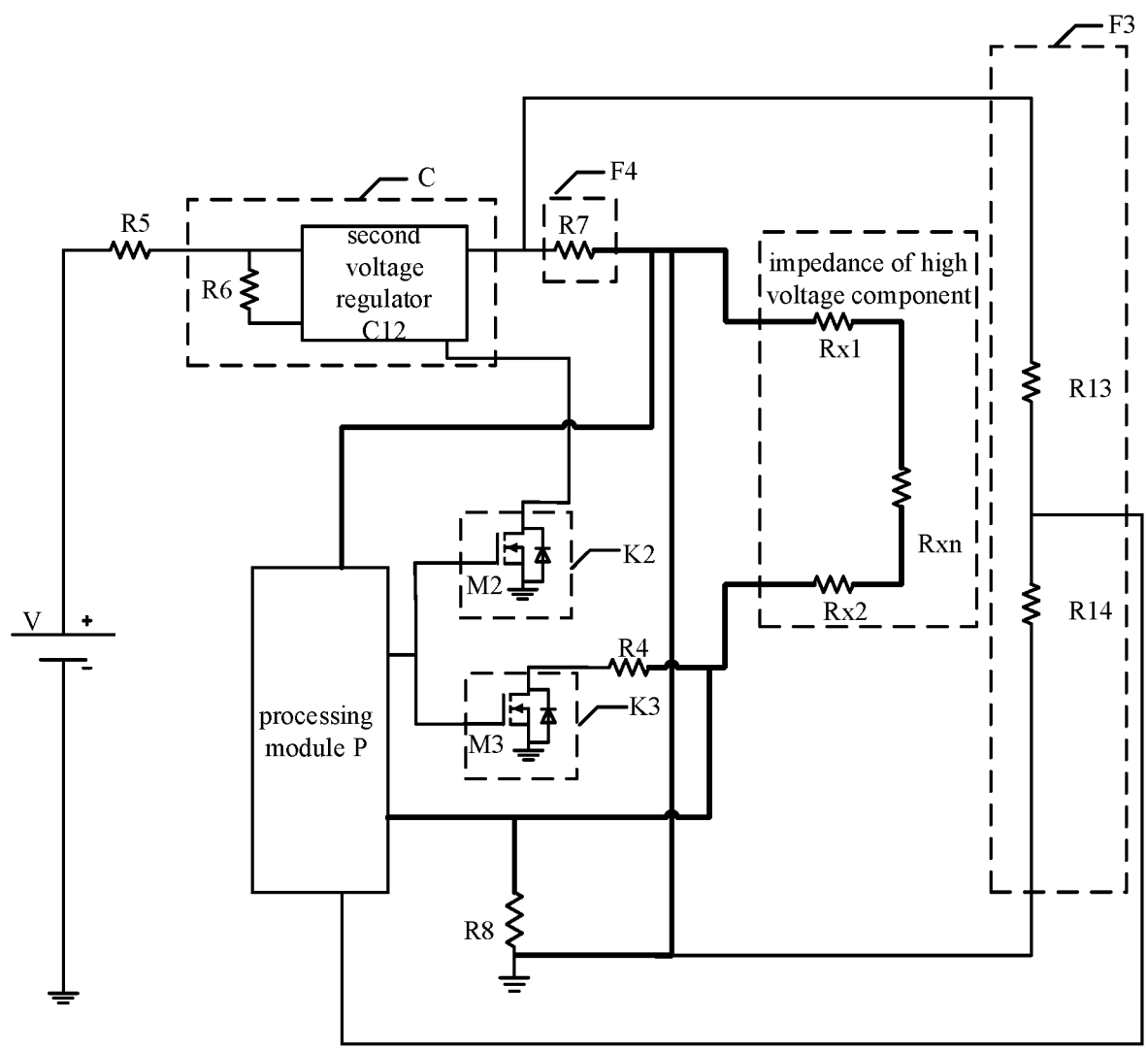
FIG. 17 is a schematic structural diagram of a high voltage component module that is short to power ground according to still some other embodiments of the disclosure.

FIG. 17 is a schematic structural diagram of the high voltage component module H that is short to the power ground according to some examples. The thickened line in FIG. 17 is the line that is short to the ground. That is, both ends of the high voltage interlock circuit are at low level. FIG. 17 is a schematic structural diagram showing that the high voltage component module H is short to the power ground as the first terminal of the high voltage interlock circuit is short to the power ground.

Figure 18:
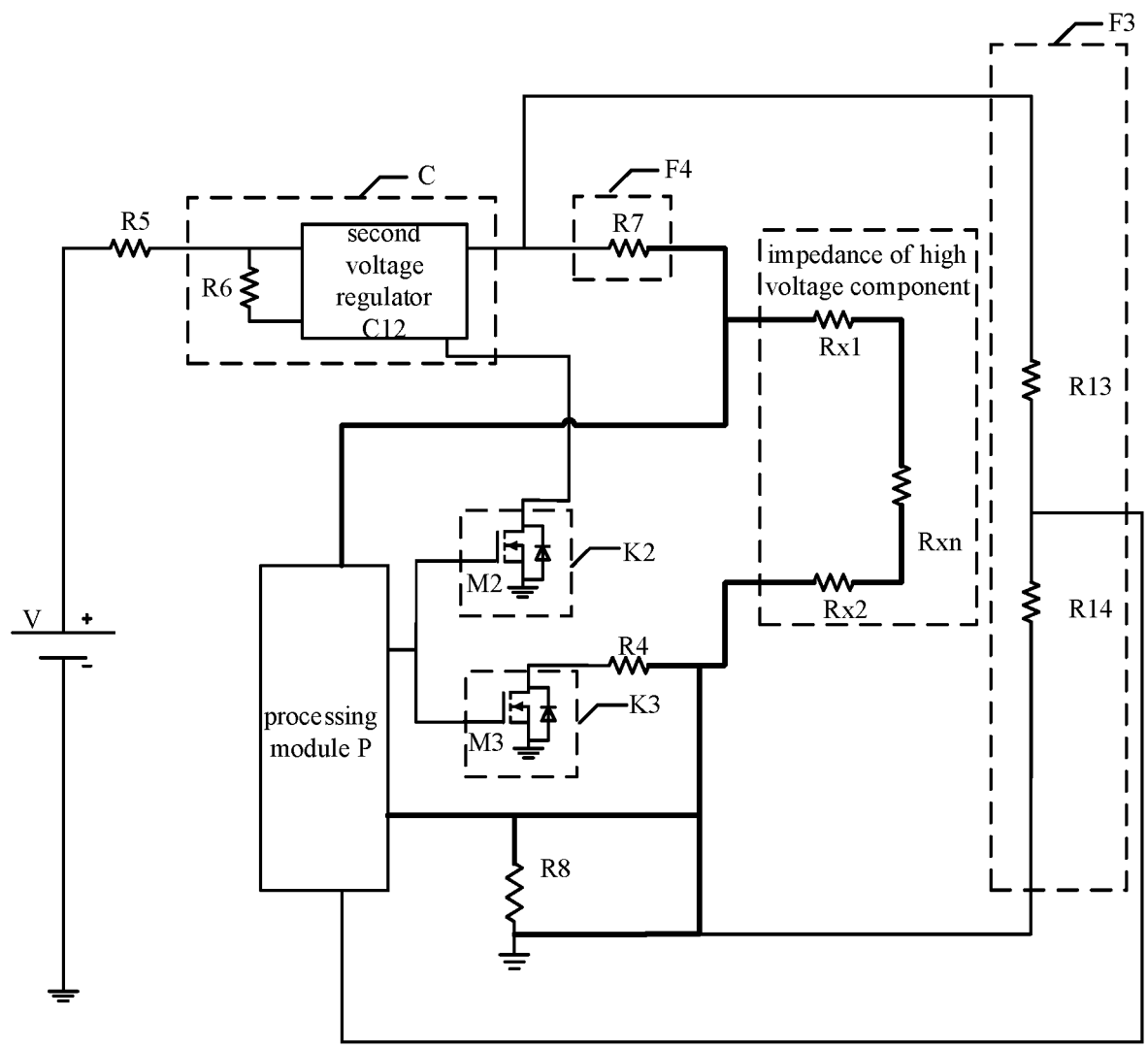
FIG. 18 is a schematic structural diagram of a high voltage component module that is short to power ground according to yet some other embodiments of the disclosure.

FIG. 18 is a schematic structural diagram of the high voltage component module H that is short to the power ground according to some other examples. The thickened line in FIG. 18 is the line that is short to the ground. That is, both ends of the high voltage interlock circuit are at low level. FIG. 18 is a schematic structural diagram showing that the high voltage component module H is short to the power ground as the second terminal of the high voltage interlock circuit is short to the power ground.

In some examples, the preset threshold T5 may be equal to the preset threshold T8. The preset threshold T6 may be equal to the preset threshold T7.

In some embodiments of the disclosure, the processing module P may be connected to the positive electrode of the power module V for collecting the output voltage of the power module V, and determining whether there is a fault in the power module V based on the output voltage of the power module V.

If the output voltage of the power module V collected by the processing module P is within a fifth preset voltage range, it may be determined that the power module V has no fault. If the output voltage of the power module V collected by the processing module P exceeds the fifth preset voltage range, it may be determined that there is a fault in the power module V.

Figure 19:
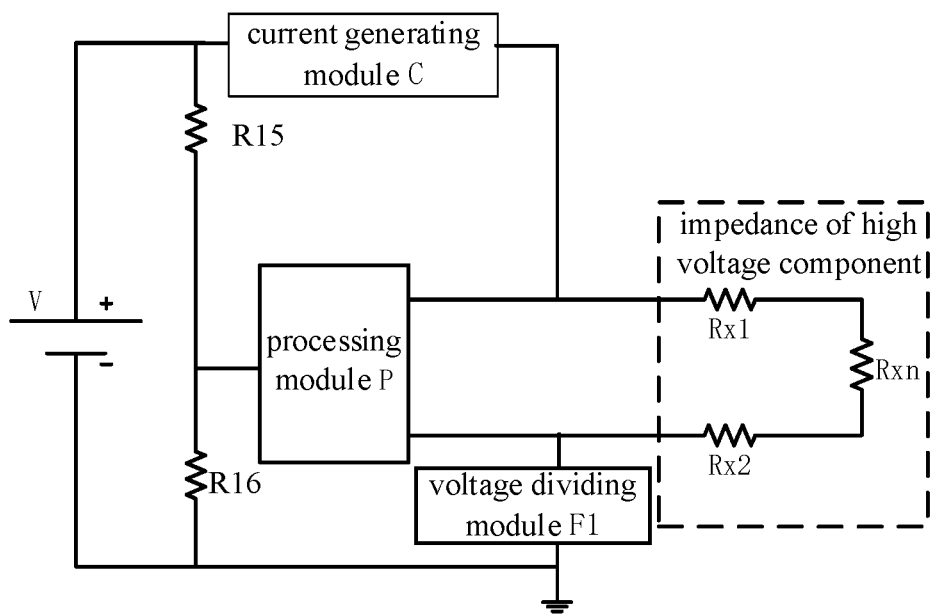
FIG. 19 is a schematic structural diagram of a high voltage interlock circuit according to a seventh embodiment of the disclosure.

In some embodiments of the disclosure, referring to FIG. 19, in order to meet the voltage sampling requirement of the processing module P, the high voltage interlock circuit may further include a resistor R15 and a resistor R16. One end of the resistor R15 is connected to the positive electrode of the power module V. The other end of the resistor R15 is respectively connected to one end of the resistor R16 and the processing module P. The other end of the resistor R16 is connected to the power ground.

Similarly, based on the normal output voltage Vd of the power module V and the resistance values of the resistor R15 and the resistor R16, the normal value range of the voltage Voutput2 collected by the processing module P at the one end of the resistor R16 may be pre-obtained.

The normal value of Voutput2 can be calculated by the following equation:

$$V_{ouput2} = V_d \times R16/(R15+R16) \qquad (8)$$

The processing module P may determine whether the collected voltage of the one end of the resistor R16 is within the normal value range of the pre-obtained Voutput2. If not, it means that there is a fault in the power module V.

By monitoring whether there is a fault in the power module V, safety can be ensured, and false detection of the fault of the high voltage component module H can be avoided.

Embodiments of the disclosure also provide a detection method of a high voltage interlock circuit applied to, for example, the high voltage interlock circuit of FIG. 1 to FIG. 19. The detection method of the high voltage interlock circuit provided by the embodiment of the disclosure may include: determining the fault of the high voltage component module H based on the first voltage collected from the second terminal of the high voltage component module H.

In an embodiment of the disclosure, since the voltage at the second terminal of the high voltage component module H is collected on the basis of a constant DC current which is not easily affected by external interference, the fault of the high voltage component module H can be determined based on the voltage collected from the second terminal of the high voltage component module H, so as to mitigate or even avoid the fault misjudgment caused by the external interference to the high voltage interlock circuit. As a result, the precision of fault detection for the high voltage component module H by the high voltage interlock circuit can be improved.

In some specific examples, if the first voltage is greater than the first preset threshold, it may be determined that the high voltage component module H is short to the power supply. If the first voltage is less than the second preset threshold, it may be determined that the high voltage component module H is open circuited and/or is short to the power ground.

The first preset threshold may be determined based on the DC current, the resistance value of the voltage dividing module F1, and the resistance value of the high voltage component module H. The second preset threshold may be determined based on the DC current and the resistance value of the voltage dividing module F1.

Methods of determination of whether there being a fault in the high voltage component module H may refer to the above description for the high voltage interlock circuit, which will not be described herein again.

In order to more accurately distinguish the fault of the high voltage component module H, in some embodiments, the fault of the high voltage component module H may also be determined based on the second voltage collected from the first terminal of the high voltage component module H and the first voltage.

Specifically, if the first voltage is less than the third preset threshold and the second voltage is greater than the fourth preset threshold, it may be determined that the fault of the high voltage component module H is an open circuit.

If the first voltage is greater than the fifth preset threshold and the second voltage is greater than the fifth preset threshold, it may be determined that the fault of the high voltage component module H is a short circuit to the power supply.

If the first voltage is less than the sixth preset threshold and the second voltage is less than the sixth preset threshold, it may be determined that the fault of the high voltage component module H is a short circuit to the power ground.

The fourth preset threshold and the fifth preset threshold may be both determined based on the DC current, the resistance value of the voltage dividing module F1, and the resistance value of the high voltage component module H. The third preset threshold and the sixth preset threshold may be both determined based on the DC current and the resistance value of the voltage dividing module F1.

Methods of determination of the three faults of the high voltage component module H may refer to the above description for the high voltage interlock circuit, which will not be described herein again.

In some embodiments of the disclosure, if the processing module P is connected to the current generating module C, the detection method of the high voltage interlock circuit may further include: performing voltage detection on the current generating module C; and determining whether there is a fault in the current generating module C based on the result of the voltage detection and/or the second voltage collected from the first terminal of the high voltage component module H.

In some examples, whether there is a fault in the current generating module C may be determined based on the second voltage. Specifically, if the second voltage meets the first preset condition, it is determined that the current generating module C has no fault. If the second voltage fails to meet the first preset condition, it is determined that there is a fault in the current generating module C.

In other examples, the processing module P is connected to the input terminal of the current generating module C, and the result of the voltage detection includes the input voltage of the current generating module C. Then, whether there is a fault in the current generating module C may be determined based on the input voltage of the current generating module C and the second voltage.

Specifically, if the first difference between the input voltage of the current generating module C and the second voltage meets the second preset condition, it may be determined that the current generating module C has no fault. If the first difference fails to meet the second preset condition, it may be determined that there is a fault in the current generating module C.

In some specific examples, referring to FIG. 4, the current generating module C may include the first voltage regulator C11 and the first regulating resistor R1. If the processing module P is connected to the output terminal of the first voltage regulator C11, the result of the voltage detection may include the output voltage of the first voltage regulator C11. The processing module P may determine whether there is a fault in the current generating module C based on the output voltage of the first voltage regulator C11 and the second voltage.

Specifically, if the second difference between the output voltage of the first voltage regulator C11 and the second voltage meets the third preset condition, it may be determined that the current generating module C has no fault. If the second difference fails to meet the third preset condition, it may be determined that there is a fault in the current generating module C.

In some specific examples, referring to FIG. 4, if the processing module P is also connected to the input terminal of the first voltage regulator C11, the result of the voltage detection may further include the input voltage of the first voltage regulator C11. Then, whether there is a fault in the current generating module C may be determined based on the input voltage of the first voltage regulator C11 and the output voltage of the first voltage regulator C11.

Specifically, if the third difference between the input voltage of the first voltage regulator C11 and the output voltage of the first voltage regulator C11 meets the fourth preset condition, it may be determined that the current generating module C has no fault. If the third difference fails to meet the fourth preset condition, it may be determined that there is a fault in the current generating module C.

In some specific examples, referring to FIG. 10, the current generating module C may include the second voltage regulator C12 and the second regulation resistor R6. If the processing module P is connected to the output terminal of the second voltage regulator C12, the result of the voltage detection may include the output voltage of the second voltage regulator C12. Then, the processing module P may determine whether there is a fault in the current generating module C based on the output voltage of the second voltage regulator C12 and the second voltage.

Specifically, if the fourth difference between the output voltage of the second voltage regulator C12 and the second voltage meets the fifth preset condition, it may be determined that the current generating module C has no fault. If the fourth difference fails to meet the fifth preset condition, it may be determined that there is a fault in the current generating module C.

In some specific examples, referring to FIG. 10, if the processing module P is also connected to the input terminal of the second voltage regulator C12, the voltage detection result may further include the input voltage of the second voltage regulator C12. Therefore, whether there is a fault in the current generating module C may be determined based on the input voltage of the second voltage regulator C12 and the output voltage of the second voltage regulator C12.

Specifically, if the fifth difference between the input voltage of the second voltage regulator C12 and the output voltage of the second voltage regulator C12 meets the sixth preset condition, it may be determined that the current generating module C has no fault. If the fifth difference fails to meet the sixth preset condition, it may be determined that there is a fault in the current generating module C. Specific manner of fault determination of the current generating module C may refer to the above description for the high voltage interlock circuit, which will not be described herein again.

It is possible to avoid false alarms for the fault of the high voltage component module H by detecting the fault of the current generating module C. As a result, the safety of the entire vehicle can be improved.

It is to be understood that various embodiments in the specification are described in a progressive manner. The same or similar parts between the various embodiments may be referred to each other, and each embodiment focuses on a different part from other embodiments. The embodiments of the detection method of the high voltage interlock circuit may refer to the description for the high voltage interlock circuit. The disclosure is not limited to the specific steps and structures described above and illustrated in the drawings. A person skilled in the art may make various changes, modifications and additions, or change the order between the steps after understanding the spirit of the disclosure. Also, a detailed description of known method techniques is omitted herein for the sake of brevity.

Those skilled in the art should understand that the above embodiments are exemplary rather than limitative. Different technical features in different embodiments may be combined to obtain beneficial effects. Other variations of the described embodiments can be understood and practiced by those skilled in the art upon studying the drawings, the specification and the claims herein. In the claims, the term "comprising" does not exclude other means or steps; the indefinite article "a" does not exclude a plurality of; the terms "first", "second" are used to illustrate names rather than to indicate any particular order. Any reference numerals in the claims should not be construed as limiting the scope of protection. The functions of the various parts in the claims may be implemented by a single hardware or software module. The presence of certain features in different dependent claims does not indicate that these technical features cannot be combined to achieve beneficial effects.

What is claimed is:

1. A high voltage interlock circuit, comprising:
   a power module, wherein a positive electrode of the power module is connected to one end of a current generating module;
   the current generating module, wherein the other end of the current generating module is connected to a first terminal of a high voltage component module to inject a constant direct current (DC) current into the high voltage component module;

a first voltage dividing module, wherein one end of the first voltage dividing module is connected to a second terminal of the high voltage component module, and the other end of the first voltage dividing module is respectively connected to a negative electrode of the power module and a power ground; and a processing module configured to determine a fault of the high voltage component module based on a first voltage collected from the second terminal of the high voltage component module and a second voltage collected from the first terminal of the high voltage component module, wherein the processing module is further configured to:

determine that the fault of the high voltage component module is an open circuit, when the first voltage is less than a third preset threshold and the second voltage is greater than a fourth preset threshold;

determine that the fault of the high voltage component module is a short circuit to power supply, when the first voltage is greater than a fifth preset threshold and the second voltage is greater than the fifth preset threshold; and determine that the fault of the high voltage component module is a short circuit to the power ground when the first voltage is less than a sixth preset threshold and the second voltage is less than the sixth preset threshold;

wherein the fourth preset threshold and the fifth preset threshold are both determined based on the DC current, a resistance value of the first voltage dividing module, and a resistance value of the high voltage component module, and the third preset threshold and the sixth preset threshold are both determined based on the DC current and the resistance value of the first voltage dividing module.

2. The circuit of claim 1, wherein the processing module is configured to:

determine that the high voltage component module is short to power supply when the first voltage is greater than a first preset threshold; and determine that the high voltage component module is open-circuited and/or is short to the power ground when the first voltage is less than a second preset threshold.

3. The circuit of claim 1, wherein the DC current is greater than or equal to 2 milliamps and less than or equal to 30 milliamps.

4. The circuit of claim 1, wherein the DC current is 10 milliamps or 20 milliamps.

5. The circuit of claim 1, wherein the processing module is configured to control an operating state of the current generating module.

6. The circuit of claim 1, wherein the processing module is connected to the current generating module and configured to:

perform voltage detection on the current generating module; and determine whether there is a fault in the current generating module based on a result of the voltage detection and/or a second voltage collected from the first terminal of the high voltage component module.

7. The circuit of claim 6, wherein the current generating module comprises a first voltage regulator and a first regulating resistor, and wherein:

an input terminal of the first voltage regulator is connected to the positive electrode of the power module, an output terminal of the first voltage regulator is connected to one end of the first regulating resistor, a feedback terminal of the first voltage regulator is connected to the other end of the first regulating resistor, and the other end of the first regulating resistor is connected to the first terminal of the high voltage component module; and the processing module is connected to the input terminal of the first voltage regulator, and/or the processing module is connected to the output terminal of the first voltage regulator;

wherein the result of the voltage detection is an input voltage of the first voltage regulator, when the processing module is connected to the input terminal of the first voltage regulator;

the result of the voltage detection is an output voltage of the first voltage regulator, when the processing module is connected to the output terminal of the first voltage regulator; and the result of the voltage detection comprises the input voltage of the first voltage regulator and the output voltage of the first voltage regulator, when the processing module is respectively connected to the input terminal of the first voltage regulator and the output terminal of the first voltage regulator.

8. The circuit of claim 6, wherein the current generating module comprises a second voltage regulator and a second regulating resistor, and wherein:

an input terminal of the second voltage regulator is respectively connected to the positive electrode of the power module and one end of the second regulating resistor, a feedback terminal of the second voltage regulator is connected to the other end of the second regulating resistor, and an output terminal of the second voltage regulator is connected to the first terminal of the high voltage component module; and the processing module is connected to the input terminal of the second voltage regulator, and/or the processing module is connected to the output terminal of the second voltage regulator;

wherein the result of the voltage detection is an input voltage of the second voltage regulator, when the processing module is connected to the input terminal of the second voltage regulator;

the result of the voltage detection is an output voltage of the second voltage regulator, when the processing module is connected to the output terminal of the second voltage regulator; and the result of the voltage detection comprises the input voltage of the second voltage regulator and the output voltage of the second voltage regulator, when the processing module is respectively connected to the input terminal of the second voltage regulator and the output terminal of the second voltage regulator.

9. The circuit of claim 1, further comprising a second voltage dividing module, wherein one end of the second voltage dividing module is connected to the current generating module, and the other end of the second voltage dividing module is connected to the first terminal of the high voltage component module.

10. The circuit of claim 1, further comprising a first switch module, wherein:

the first switch module is disposed between the power module and the current generating module, and the first switch module is connected to the processing module; and the processing module is configured to control On-Off of the high voltage interlock circuit and an operating state of the current generating module by the first switch module.

11. The circuit of claim 10, wherein the first switch module comprises:
a first switch unit, wherein a first terminal of the first switch unit is respectively connected to the positive electrode of the power module and one end of a first resistor network, and a second terminal of the first switch unit is connected to the current generating module;
the first resistor network, wherein the other end of the first resistor network is respectively connected to a third terminal of the first switch unit and one end of a second resistor network;
the second resistor network, wherein the other end of the second resistor network is connected to a first terminal of a second switch unit; and
the second switch unit, wherein a second terminal of the second switch unit is connected to the processing module, and a third terminal of the second switch unit is connected to the power ground.

12. The circuit of claim 1, further comprising:
a second switch module, wherein a first terminal of the second switch module is connected to the current generating module, a second terminal of the second switch module is connected to the processing module, and a third terminal of the second switch module is connected to the power ground; and
a third switch module, a first terminal of the third switch module is connected to the first voltage dividing module, a second terminal of the third switch module is connected to the processing module, and a third terminal of the third switch module is connected to the power ground;
wherein the processing module is configured to control an operating state of the current generating module using the second switch module, and to control On-Off of the high voltage interlock circuit using the third switch module.

13. A method for detection of the high voltage interlock circuit of claim 1, wherein the method comprises:
determining a fault of the high voltage component module based on a first voltage collected from the second terminal of the high voltage component module and a second voltage collected from the first terminal of the high voltage component module,
wherein the method further comprises:
determining that the fault of the high voltage component module is an open-circuit, when the first voltage is less than a third preset threshold and the second voltage is greater than a fourth preset threshold;
determining that the fault of the high voltage component module is a short circuit to power supply, when the first voltage is greater than a fifth preset threshold and the second voltage is greater than the fifth preset threshold; and
determining that the fault of the high voltage component module is a short circuit to the power ground when the first voltage is less than a sixth preset threshold and the second voltage is less than the sixth preset threshold;
wherein the fourth preset threshold and the fifth preset threshold are both determined based on the DC current, a resistance value of the first voltage dividing module, and a resistance value of the high voltage component module, and the third preset threshold and the sixth preset threshold are both determined based on the DC current and the resistance value of the first voltage dividing module.

* * * * *